(12) United States Patent
Yamamoto et al.

(10) Patent No.: US 12,328,814 B2
(45) Date of Patent: Jun. 10, 2025

(54) PRINTED WIRING BOARD AND METHOD FOR MANUFACTURING PRINTED WIRING BOARD

(71) Applicant: TANAZAWA HAKKOSHA CO., LTD., Higashiosaka (JP)

(72) Inventors: Keiichiro Yamamoto, Higashiosaka (JP); Kazuo Tani, Higashiosaka (JP); Masaharu Yano, Higashiosaka (JP)

(73) Assignee: TANAZAWA HAKKOSHA CO., LTD., Higashiosaka (JP)

( * ) Notice: Subject to any disclaimer, the term of this patent is extended or adjusted under 35 U.S.C. 154(b) by 0 days.

(21) Appl. No.: 18/600,437

(22) Filed: Mar. 8, 2024

(65) Prior Publication Data

US 2024/0244744 A1 Jul. 18, 2024

Related U.S. Application Data

(62) Division of application No. 17/772,453, filed as application No. PCT/JP2020/040252 on Oct. 27, 2020, now Pat. No. 11,979,982.

(30) Foreign Application Priority Data

Oct. 30, 2019 (JP) .................. 2019-197471

(51) Int. Cl.
*H05K 1/02* (2006.01)
*B29C 70/30* (2006.01)
(Continued)

(52) U.S. Cl.
CPC ............ *H05K 1/038* (2013.01); *H05K 1/036* (2013.01); *H05K 3/0058* (2013.01); *H05K 2201/029* (2013.01)

(58) Field of Classification Search
CPC .......... H05K 1/02; H05K 1/036; H05K 1/038; H05K 1/0366; H05K 3/00; H05K 3/0002;
(Continued)

(56) References Cited

U.S. PATENT DOCUMENTS 4,011,766 A * 3/1977 Waugh ...................... F16G 5/06
474/205
4,131,030 A * 12/1978 White, Jr. ................ F16G 5/06
156/139
(Continued)

FOREIGN PATENT DOCUMENTS

JP  S5857935 A   4/1983
JP  H0515462 U   2/1993
(Continued)

*Primary Examiner* — Xiaoliang Chen
(74) *Attorney, Agent, or Firm* — Rabin & Berdo, P.C.

(57) ABSTRACT

A printed wiring board having a sheet material including a cloth-like material woven of reinforced fiber. An angle between a warp thread and a weft thread of the reinforced fiber of the sheet material is 90 degrees. In the sheet material, threads configuring the cloth-like material are cut so that one side of a circumferential edge portion of the sheet material is tilted leftward or rightward at an angle no smaller than 5 degrees and no larger than 30 degrees and a length of a cut portion obtained by cutting out the cloth-like-material configuration threads aligned on a cutting blade with the cutting blade is longer by 0.3 mm to 6.3 mm than a total length of a clearance between an upper blade and a lower blade configuring the cutting blade for cutting the cloth-like material and a thickness of the cloth-like-material configuration threads aligned on the cutting blade.

2 Claims, 30 Drawing Sheets

(51) Int. Cl.
*B32B 5/10* (2006.01)
*B32B 5/12* (2006.01)
*B32B 5/26* (2006.01)
*B32B 15/08* (2006.01)
*B32B 15/14* (2006.01)
*B32B 15/20* (2006.01)
*H05K 1/03* (2006.01)
*H05K 3/00* (2006.01)
*H05K 3/02* (2006.01)

(58) Field of Classification Search
CPC .. H05K 3/0058; H05K 2201/029; B32B 5/10; B32B 5/12; B32B 5/26; B32B 15/08; B32B 15/14; B32B 15/20; B29C 70/30; B29C 70/382
USPC ...... 174/255; 428/34.5, 36.3, 103, 107, 111, 428/113, 376, 902; 156/178, 181, 187, 156/188, 190, 215, 313
See application file for complete search history.

(56) References Cited

U.S. PATENT DOCUMENTS

| | | |
|---|---|---|
| 4,131,701 A | 12/1978 | Vanauken |
| 4,214,932 A * | 7/1980 | Van Auken ............. F16C 3/023 |
| | | 156/215 |
| 5,088,735 A | 2/1992 | Shigetoh |
| 2004/0089365 A1* | 5/2004 | Heger ................... D21F 1/0045 |
| | | 139/383 A |
| 2007/0202295 A1* | 8/2007 | Kamiya ................. D03D 11/00 |
| | | 428/103 |
| 2009/0114135 A1* | 5/2009 | Skinner ..................... B32B 5/26 |
| | | 156/181 |
| 2009/0155523 A1* | 6/2009 | Thoral-Pierre ....... F41H 5/0485 |
| | | 428/113 |
| 2010/0081516 A1* | 4/2010 | Nakamura .............. B29C 70/22 |
| | | 156/190 |
| 2010/0310380 A1 | 12/2010 | Bech |
| 2011/0206893 A1* | 8/2011 | Bottger ................. F41H 5/0485 |
| | | 428/107 |
| 2016/0288454 A1* | 10/2016 | Kamiya ................... B32B 5/12 |
| 2022/0152973 A1 | 5/2022 | Isaki et al. |
| 2023/0026493 A1 | 1/2023 | Yamamoto et al. |

FOREIGN PATENT DOCUMENTS

| | | |
|---|---|---|
| JP | H0563338 A | 3/1993 |
| JP | H08139424 A | 5/1996 |
| JP | H10100375 A | 4/1998 |
| JP | 2003031912 A | 1/2003 |

* cited by examiner

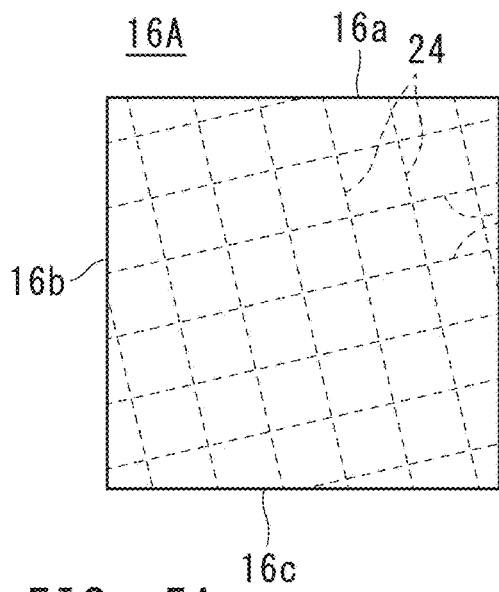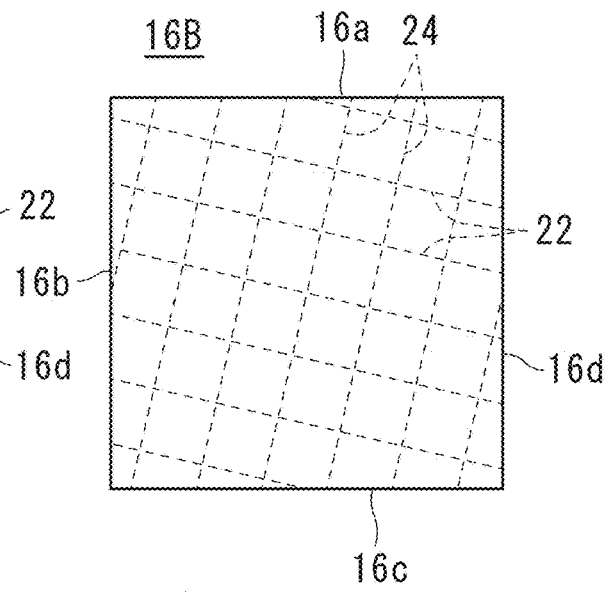
FIG. 5A  FIG. 5B
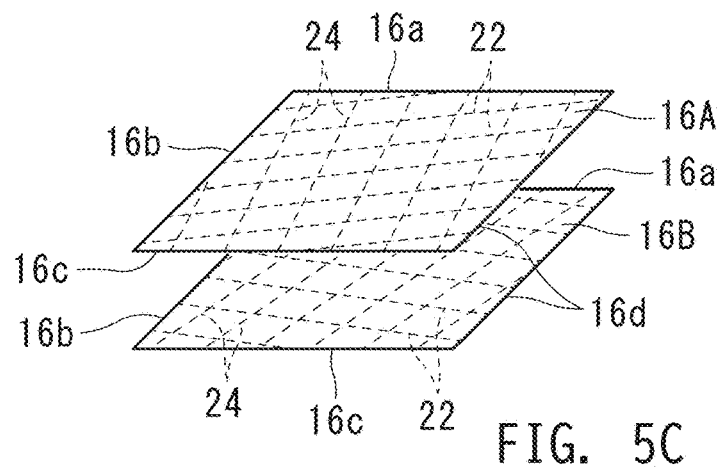
FIG. 5C
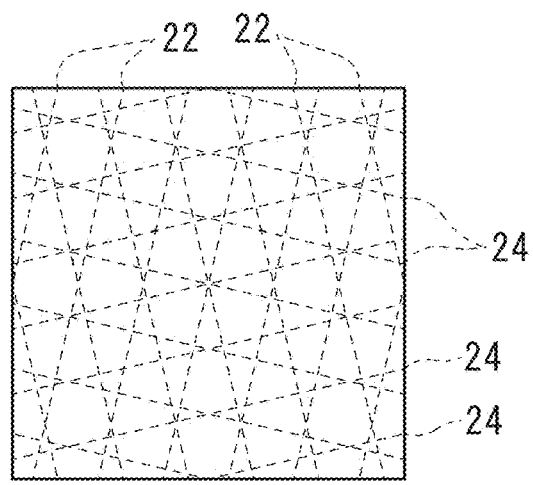
FIG. 5D

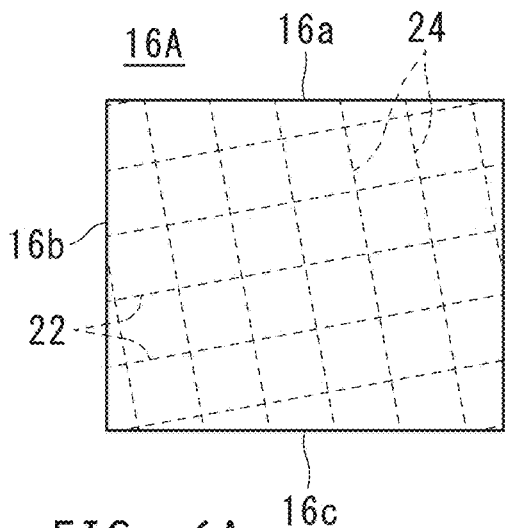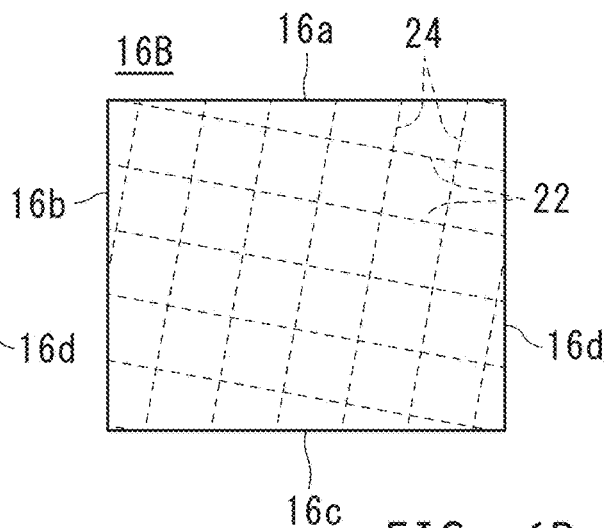
FIG. 6A     FIG. 6B
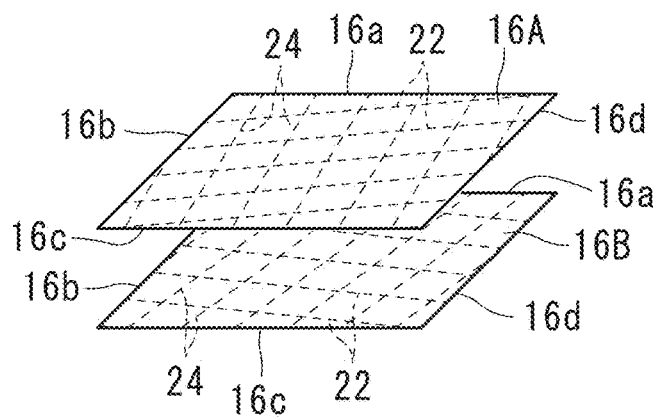
FIG. 6C
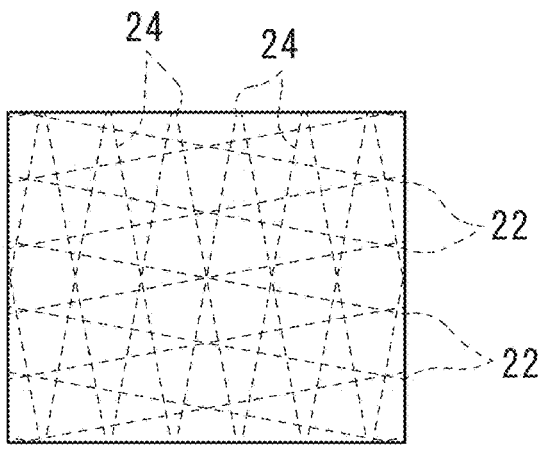
FIG. 6D

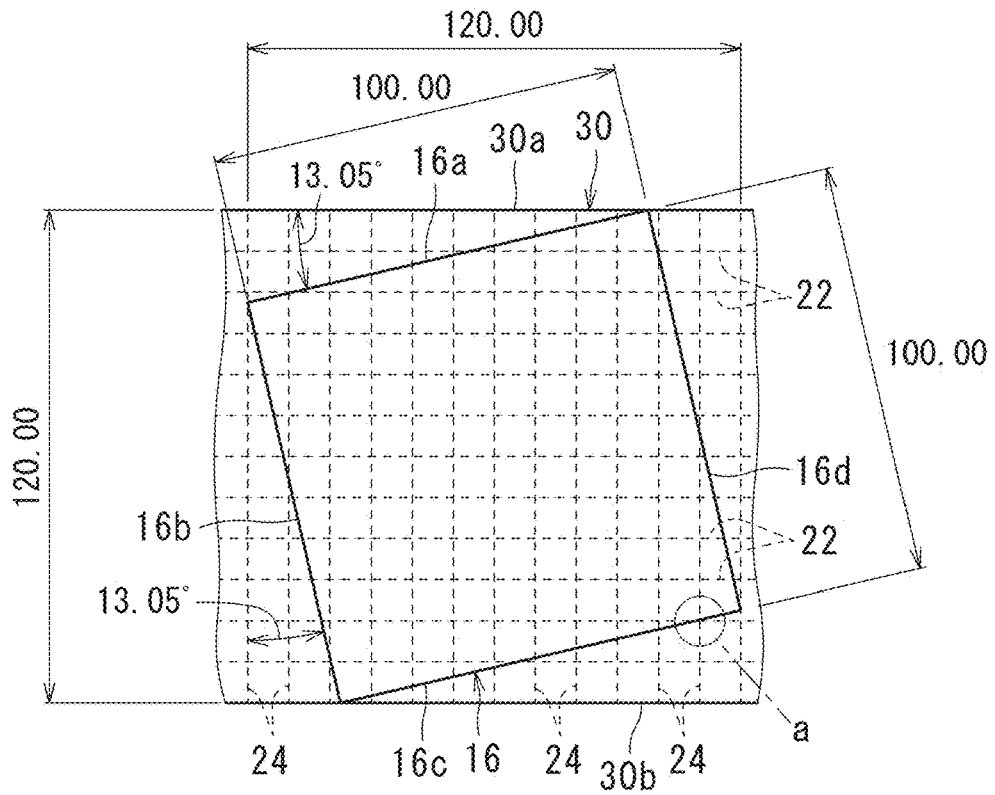
FIG. 8B(1)
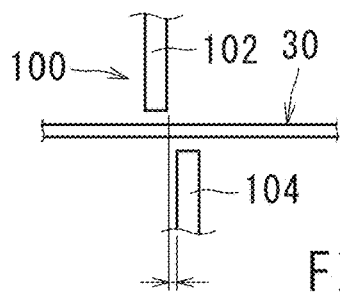
FIG. 8B(2)
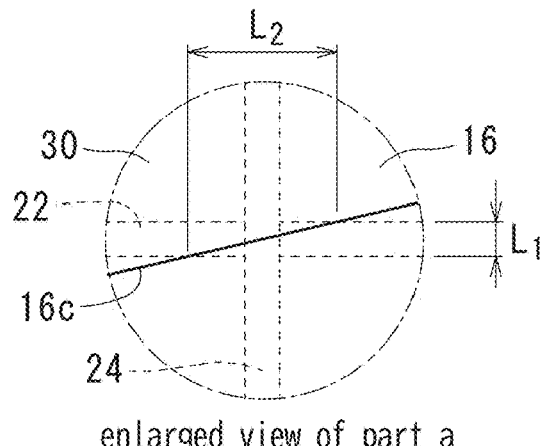
enlarged view of part a
FIG. 8B(3)
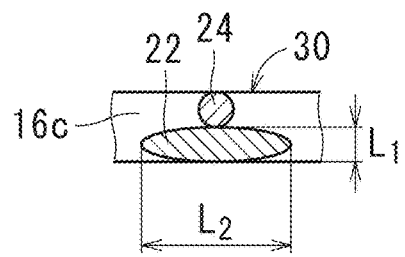
FIG. 8B(4)

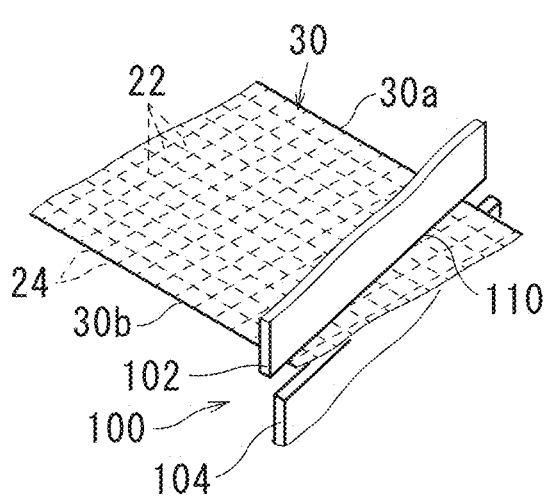
FIG. 8C(1)
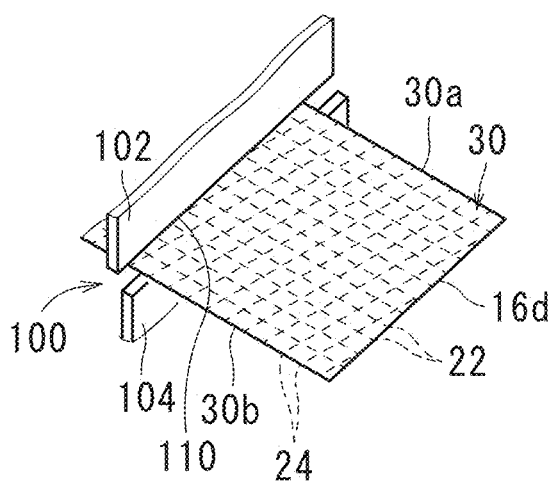
FIG. 8C(2)
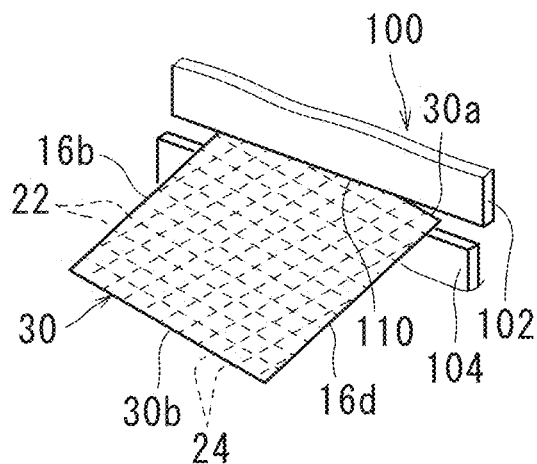
FIG. 8C(3)
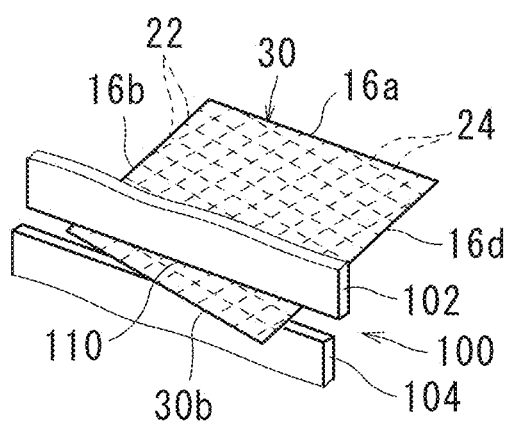
FIG. 8C(4)
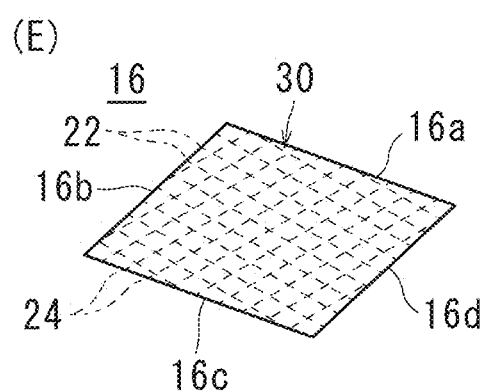
FIG. 8C(5)

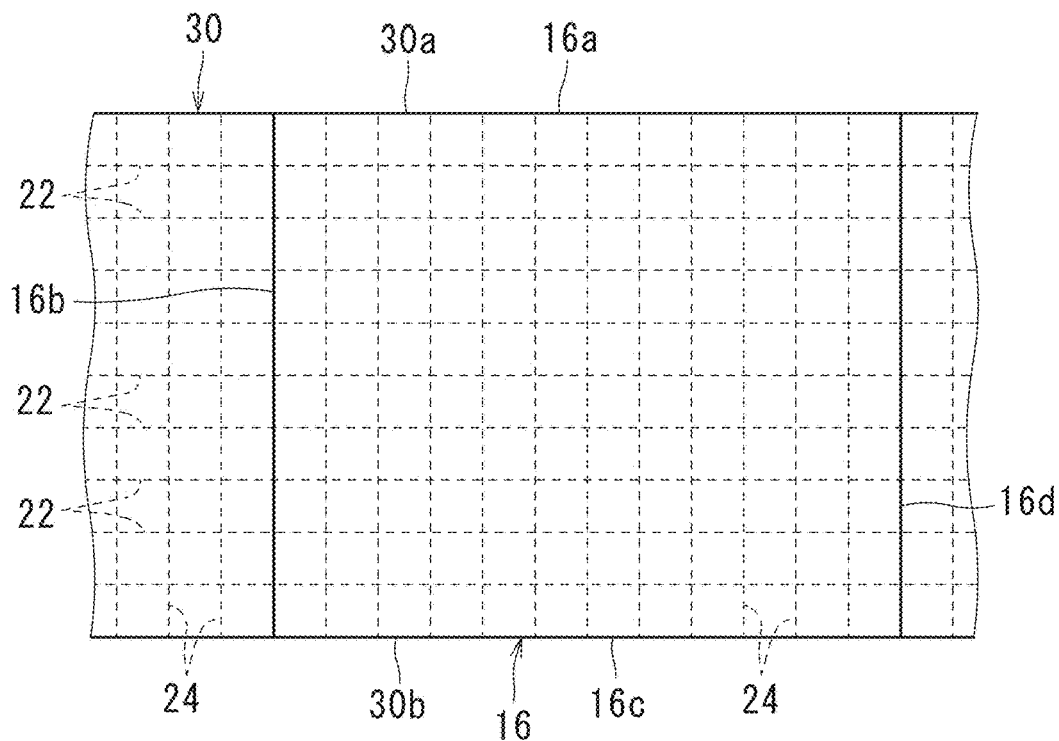
FIG. 10B(1)
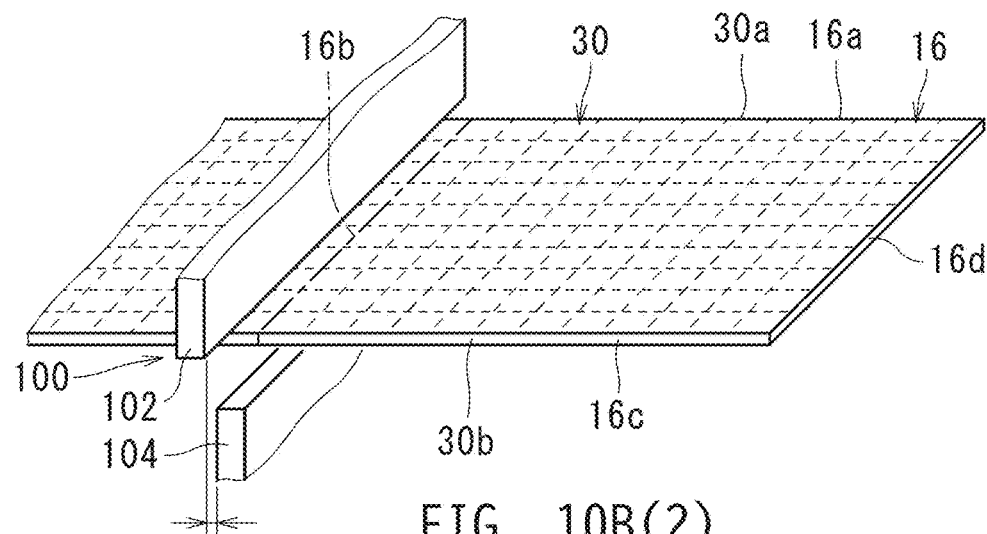
FIG. 10B(2)
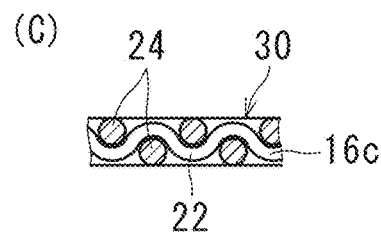
FIG. 10B(3)

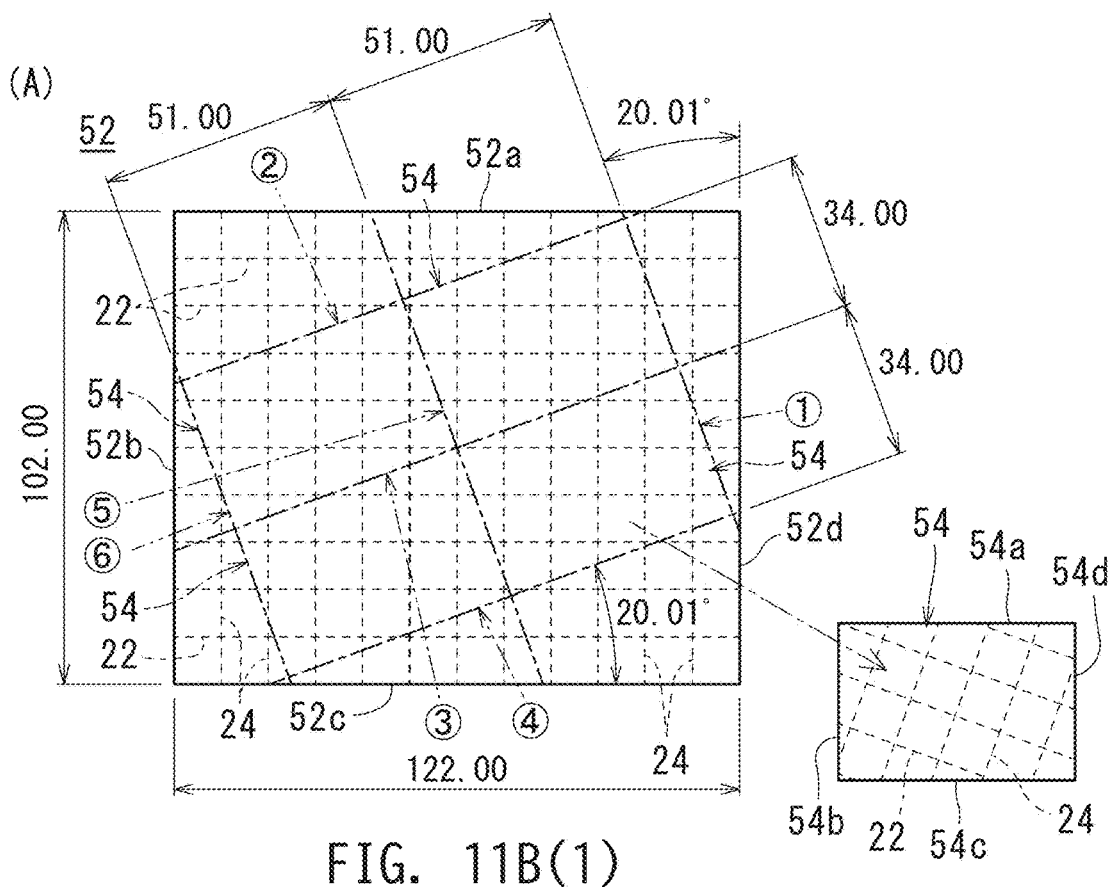
FIG. 11B(1)
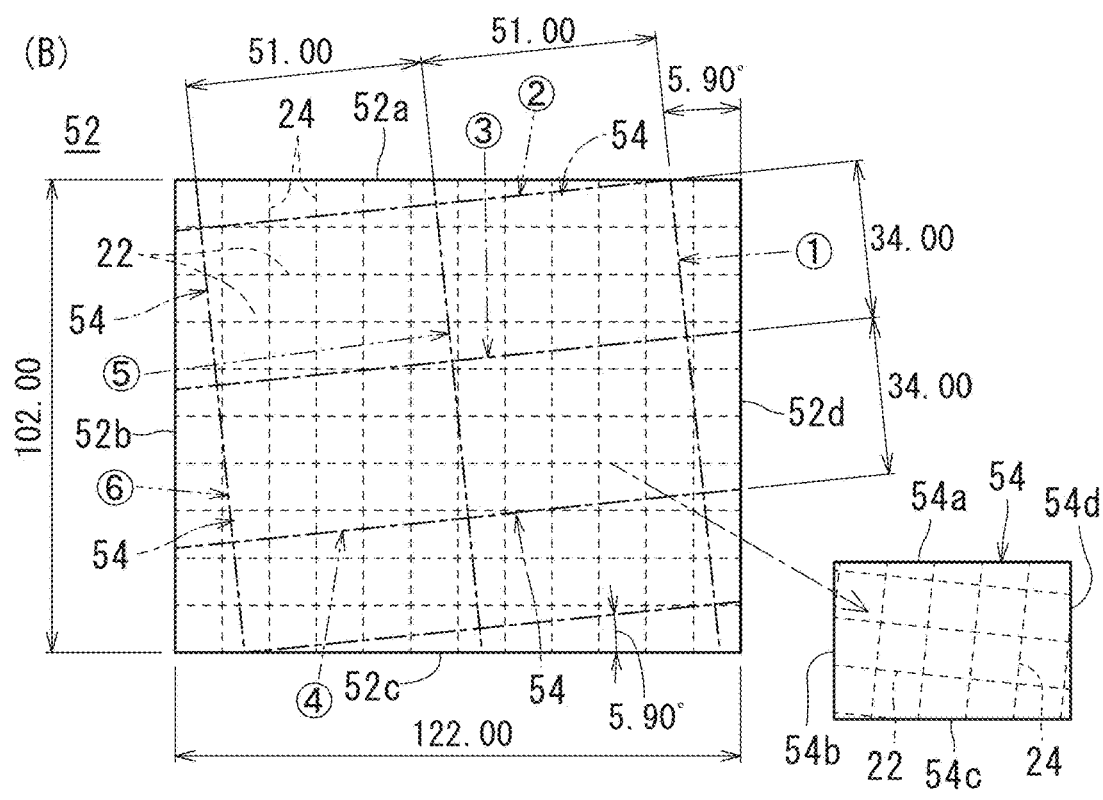
FIG. 11B(2)

A-A cross-sectional view

B-B cross-sectional view enlarged photo of part a
100 (lower blade)

PRINTED WIRING BOARD AND METHOD FOR MANUFACTURING PRINTED WIRING BOARD

CROSS REFERENCE TO RELATED APPLICATIONS

This is a divisional application of co-pending U.S. application Ser. No. 17/772,453 filed on Apr. 27, 2022, and allowed on Dec. 27, 2023, which was a National Stage application PCT/JP2020/040252, filed on Oct. 27, 2020. The co-pending US application and the present divisional application also claim the benefit of priority of Japanese Patent Application No. 2019-197471, filed on Oct. 30, 2019. The disclosures of these prior US and foreign applications are incorporated herein by reference.

TECHNICAL FIELD

The present invention relates to a printed wiring board and printed wiring board manufacturing method and, in particular, to a printed wiring board including a cloth-like material woven of reinforced fiber and a method of manufacturing the printed wiring board.

BACKGROUND ART

Conventionally, a printed wiring board has been manufactured by taking, as a reinforcing material, a glass cloth manufactured by weaving, for example, glass fiber, as reinforced fiber, and impregnating the glass cloth with resin. The printed wiring board including this glass cloth is subjected to processing, in relation to work efficiency, in which printed wiring boards are collectively formed and then cut out to a predetermined size. The glass fiber is short fiber, and is formed by twisting the short fiber into a thread. Thus, when cutting is performed in the same direction as the fiber direction of the glass fiber, the glass fiber cannot be completely cut, causing fuzzing and fiber waste. When fiber waste is attached on the surface of the printed wiring board, there is a problem of causing a soldering defect by the fiber waste at the time of soldering.

To address this, Patent Literature 1 discloses a method of cutting out a printed wiring board at an angle not orthogonal to the direction of glass fiber to suppress the occurrence of fuzzing and fiber waste occurring when the printed wiring board is processed.

RELATED ART LITERATURE

Patent Literature

PTL 1: Japanese Unexamined Patent Application Publication No. 2003-31912

SUMMARY OF INVENTION

Technical Problem

However, there is a problem in which, most of the generally-manufactured preprinted wiring boards before processing are formed so that the fiber direction is along the circumferential edge portion of the board and, to manufacture a printed wiring board with the direction of glass fiber being a bias direction (diagonal direction), a special apparatus is required to be used for cutting-out, thereby incurring costs.

Thus, a main object of the present invention is to provide a printed wiring board manufacturing method and printed wiring board in which fiber waste does not occur at the time of cutting the printed wiring board and fuzzing can be prevented. Another object is to provide a printed wiring board and printed wiring board manufacturing method in which the occurrence of fiber waste is suppressed even with cutting by a shear apparatus or the like and losses due to unusable boards can be decreased.

Solution to Problem

A printed wiring board manufacturing method according to this invention includes:
a step of preparing a sheet material including a cloth-like material woven of reinforced fiber with an angle between a warp thread and a weft thread of the reinforced fiber being 90 degrees;
a step of arranging the sheet material on a cutting-out apparatus so that the sheet material is tilted either one of leftward and rightward at an angle equal to or larger than 5 degrees and equal to or smaller than 30 degrees with respect to threads configuring the cloth-like material of the sheet material and a cut portion is cut so as to cross the cloth-like-material configuration threads aligned on a cutting blade at an angle equal to or larger than 5 degrees and equal to or smaller than 30 degrees;
a step of cutting out the sheet material from the tilted sheet material with the cut portion crossing the cloth-like-material configuration threads aligned on the cutting blade at an angle equal to or larger than 5 degrees and equal to or smaller than 30 degrees to form the sheet material with a circumferential edge portion of the sheet material crossing the cloth-like material configuration threads at an angle equal to or larger than 5 degrees and equal to or smaller than 30 degrees;
a step of creating a mother laminate configured with the sheet material as an inner-layer board or an insulating board;
a step of forming a metal layer on a surface of the mother laminate; and
a step of providing a conductor pattern on the metal layer of the mother laminate along a circumferential edge portion of the mother laminate.

A printed wiring board according to this invention is
a printed wiring board including a sheet material including a cloth-like material woven of reinforced fiber, wherein
the cloth-like material is woven at an angle between a warp thread and a weft thread of the reinforced fiber of the sheet material being 90 degrees,
in the sheet material, threads configuring the cloth-like material are cut so that one side of a circumferential edge portion of the sheet material is tilted either one of leftward and rightward at an angle equal to or larger than 5 degrees and equal to or smaller than 30 degrees and a length of a cut portion obtained by cutting out the cloth-like-material configuration threads aligned on a cutting blade with the cutting blade is longer by 0.3 mm to 6.3 mm than a total length of a clearance between an upper blade and a lower blade configuring the cutting blade for cutting the cloth-like material and a thickness of the cloth-like-material configuration threads aligned on the cutting blade, and the sheet material configures an inner-layer board or an insulating board, a metal layer is formed on a surface of the sheet material, and a conductor pattern is formed on the metal layer.

A printed wiring board manufacturing method according to this invention includes:

a step of preparing a sheet material formed of cutting, in a direction orthogonal to or parallel to a warp thread and a weft thread, a cloth-like material woven with an angle between the warp thread and the weft thread of reinforced fiber being 90 degrees;

a step of forming a metal layer on a surface of the sheet material;

a step of preparing a mother laminate including the sheet material having the cloth-like material woven with the angle between the warp thread and the weft thread of the reinforced fiber being 90 degrees as an inner-layer board or an insulating board;

a step of arranging the mother laminate on a cutting-out apparatus so that the mother laminate is tilted either one of leftward and rightward at an angle equal to or larger than 5 degrees and equal to or smaller than 30 degrees with respect to threads configuring the cloth-like material of the mother laminate and a cut portion is cut so as to cross the cloth-like-material configuration threads aligned in a cutting direction at an angle equal to or larger than 5 degrees and equal to or smaller than 30 degrees;

a step of creating a workpiece of a desired size by cutting out the tilted mother laminate so that the cut portion is cut so as to cross the cloth-like-material configuration threads of the sheet material aligned in the cutting direction at an angle equal to or larger than 5 degrees and equal to or smaller than 30 degrees; and a step of providing a conductor pattern on the metal layer along a circumferential edge portion of the workpiece.

A printed wiring board according to this invention is a printed wiring board including a sheet material including a cloth-like material woven of reinforced fiber, wherein the sheet material is woven with an angle between a warp thread and a weft thread of the reinforced fiber being 90 degrees and configures a mother laminate as an inner-layer board or an insulating board, and in the mother laminate, a circumferential edge portion of the mother laminate is cut and threads configuring the cloth-like material of the sheet material are cut so that one side of a circumferential edge portion of the mother laminate is tilted either one of leftward and rightward at an angle equal to or larger than 5 degrees and equal to or smaller than 30 degrees and a length of a cut portion obtained by cutting the cloth-like-material configuration threads aligned on a cutting blade with the cutting blade is longer by 0.3 mm to 6.3 mm than a total length of a clearance between an upper blade and a lower blade configuring the cutting blade for cutting the cloth-like material and a thickness of the cloth-like-material configuration threads aligned on the cutting blade, a metal layer is formed on a surface of the sheet material of the mother laminate, and a conductor pattern is formed on the metal layer.

A printed wiring board manufacturing method according to this invention includes:

a step of preparing a sheet material including a cloth-like material woven of reinforced fiber with an angle between a warp thread and a weft thread of the reinforced fiber being 90 degrees;

a step of forming a metal layer on a surface of the sheet material;

a step of preparing a mother laminate including, as an inner-layer board or an insulating board, the sheet material including the cloth-like material woven with an angle between a warp thread and a weft thread of the reinforced fiber being 90 degrees;

a step of arranging the mother laminate on a pattern formation printing apparatus so that the mother laminate is tilted either one of leftward and rightward at an angle equal to or larger than 5 degrees and equal to or smaller than 30 degrees with respect to threads configuring the cloth-like material of the sheet material of the mother laminate and a cut portion is cut so as to cross the cloth-like-material configuration threads of the sheet material aligned on a cutting blade at an angle equal to or larger than 5 degrees and equal to or smaller than 30 degrees;

a step of providing, on the tilted mother laminate, a conductor pattern on the metal layer by the pattern formation printing apparatus so that the cut portion crosses the cloth-like-material configuration threads aligned on the cutting blade at an angle equal to or larger than 5 degrees and equal to or smaller than 30 degrees;

a step of cutting out the mother laminate along the conductor pattern and creating a workpiece with the cut portion crossing the cloth-like-material configuration threads of the sheet material aligned on the cutting blade at an angle equal to or larger than 5 degrees and equal to or smaller than 30 degrees; and a step of providing a conductor pattern on the metal layer along a circumferential edge portion of the workpiece.

A printed wiring board according to this invention is a printed wiring board including a sheet material including a cloth-like material woven of reinforced fiber, wherein the sheet material is woven with an angle between a warp thread and a weft thread of the reinforced fiber being 90 degrees and configures a mother laminate as an inner-layer board or an insulating board, a conductor pattern of the printed wiring board is provided on a metal layer of the mother laminate so that threads configuring the cloth-like material of the mother laminate is tilted either one of leftward and rightward at an angle equal to or larger than 5 degrees and equal to or smaller than 30 degrees to one side of the circumferential edge portion of the conductor pattern of the printed wiring board and a length of a cut portion obtained by cutting the cloth-like-material configuration threads aligned on a cutting blade with the cutting blade is longer by 0.3 mm to 6.3 mm than a total length of a clearance between an upper blade and a lower blade configuring the cutting blade for cutting the cloth-like material of the mother laminate and a thickness of the cloth-like-material configuration threads aligned on the cutting blade, and the mother laminate is cut along the conductor pattern, the threads configuring the cloth-like material of the sheet material of the mother laminate are cut with the cut portion of the mother laminate crossing the cloth-like-material configuration threads of the sheet material aligned on the cutting blade at an angle equal to or larger than 5 degrees and equal to or smaller than 30 degrees.

Advantageous Effects of Invention

According to the printed wiring board manufacturing method of this invention, a printed wiring board can be provided in which fiber waste does not occur at the time of cutting the printed wiring board and fuzzing can be prevented.

According to the printed wiring board of this invention, a printed wiring board can be provided in which fiber waste does not occur at the time of cutting the printed wiring board and fuzzing can be prevented.

According to the printed wiring board manufacturing method of this invention, a printed wiring board can be provided in which the occurrence of fiber waste is suppressed even with cutting by a shear apparatus or the like and losses due to unusable boards can be decreased.

According to the printed wiring board of this invention, a printed wiring board can be provided in which the occurrence of fiber waste is suppressed even with cutting by a shear apparatus or the like and losses due to unusable boards can be decreased.

The above-described objects and other objects, features, and advantages of the present invention will become more apparent from the following description of embodiments for implementing the invention with reference to the drawings.

BRIEF DESCRIPTION OF DRAWINGS

FIG. 1A and FIG. 1B depict diagrams of a sheet material according to the present invention, in which FIG. 1A is a plan view FIG. 1B is a plan view depicting a process of forming a sheet material from a prepreg.

FIG. 2A and FIG. 2B depict sectional views of a printed wiring board, in which FIG. 2A is a sectional view of the prepreg and FIG. 2B is a sectional view of the printed wiring board.

FIG. 4A and FIG. 4B depict diagrams of the printed wiring board, in which FIG. 4A is a plan view of the printed wiring board and FIG. 4B is a cross-sectional view of the printed wiring board.

FIG. 5A, FIG. 5B, FIG. 5C and FIG. 5D are diagrams depicting a method of forming a plurality of layers of prepregs with a reverse bias.

FIG. 6A, FIG. 6B, FIG. 6C and FIG. 6D are diagrams depicting a method of forming a plurality of layers of prepregs with a reverse bias.

FIG. 8B(1), FIG. 8B(2), FIG. 8B(3) and FIG. 8B(4) are diagrams depicting a process of forming a sheet material by cutting the prepreg, in FIG. 8B(1) is a plan view, FIG. 8B(2) is a sectional view depicting a process of forming the sheet material by cutting the prepreg, and FIG. 8B(3) is a plan view depicting the process of forming the sheet material by cutting the prepreg, and FIG. 8B(4) is a sectional view depicting a state of the cut prepreg.

FIG. 8C(1), FIG. 8C(2), FIG. 8C(3), FIG. 8C(4) and FIG. 8C(5) are perspective views depicting the method of forming the sheet material by cutting the prepreg.

FIG. 10B(1), FIG. 10B(2) and FIG. 10B(3) are diagrams depicting a process of forming the sheet material from the prepreg, in which FIG. 10B(1). is a plan view and FIG. 10B(2) is a perspective view.

FIG. 11B(1) and FIG. 11B(2) are plan views depicting a process of forming a plurality of sheet materials from the prepreg.

FIG. 16A, FIG. 16B and FIG. 16C are diagrams depicting a relation between the cutting blade and warp threads and weft threads of a cloth-like material, in which FIG. 16A is a plan view, FIG. 16B is an A-A sectional view, and FIG. 16C is a B-B sectional view.

DESCRIPTION OF EMBODIMENTS

1. Printed Wiring Board

Figure 1A:
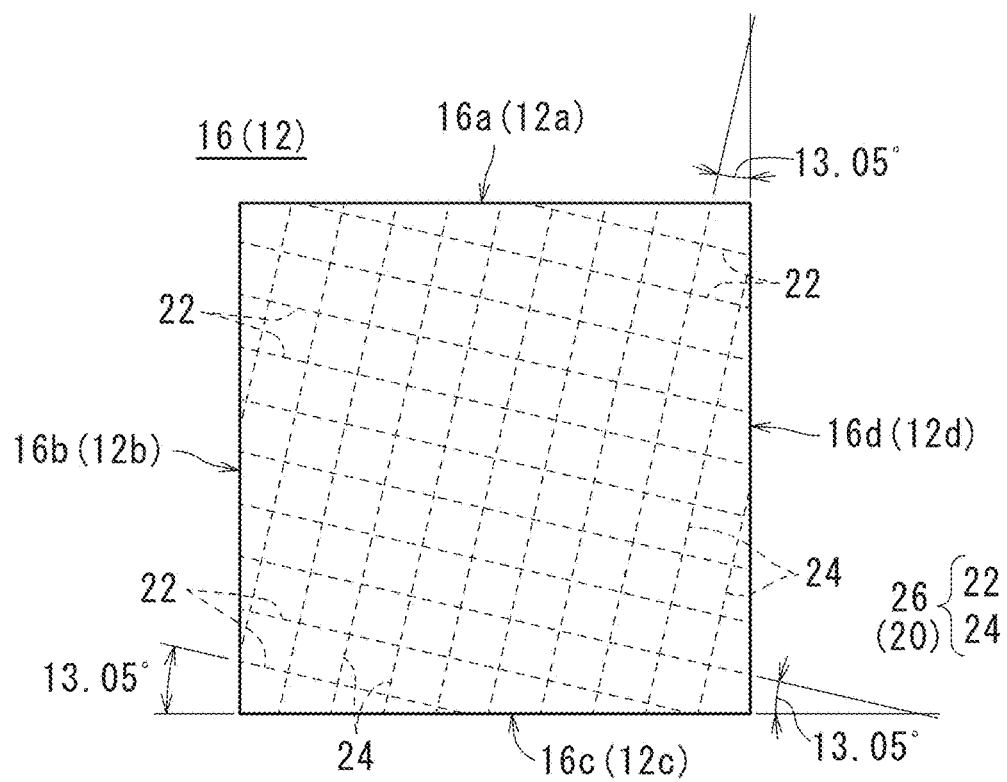
Figure 1B:
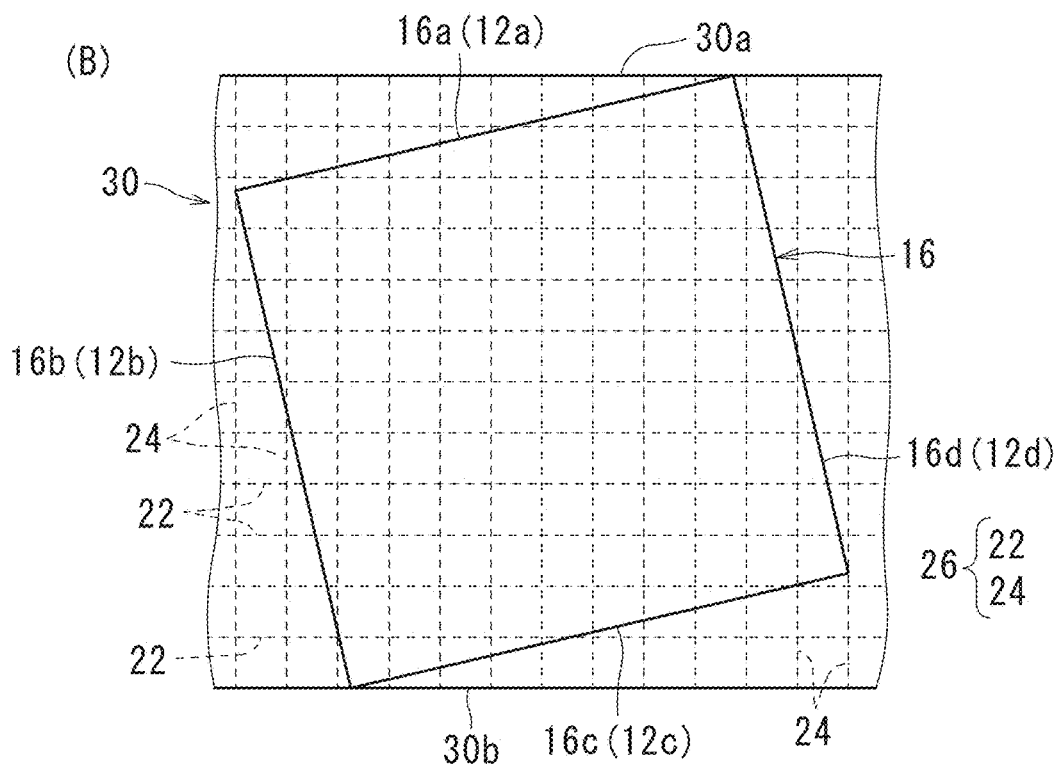
Figure 2A:
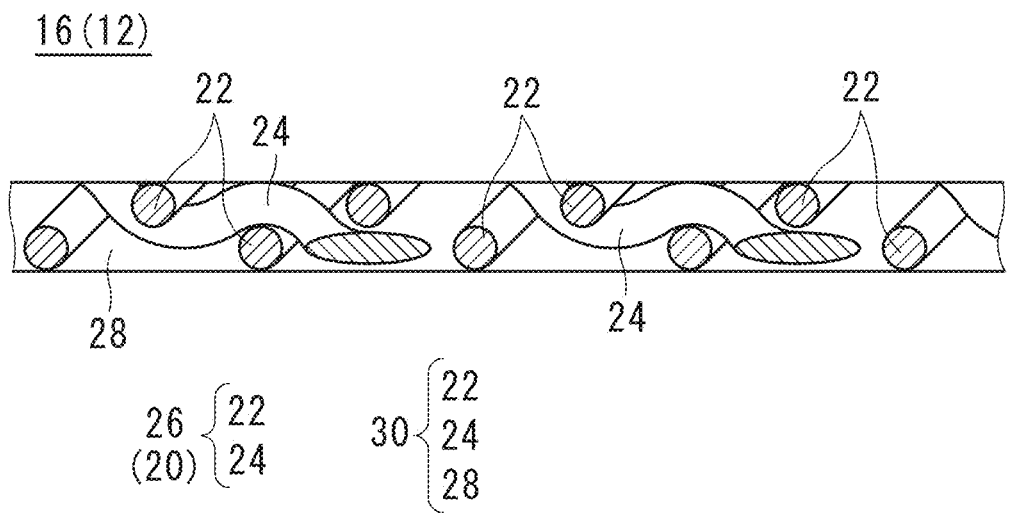
Figure 2B:
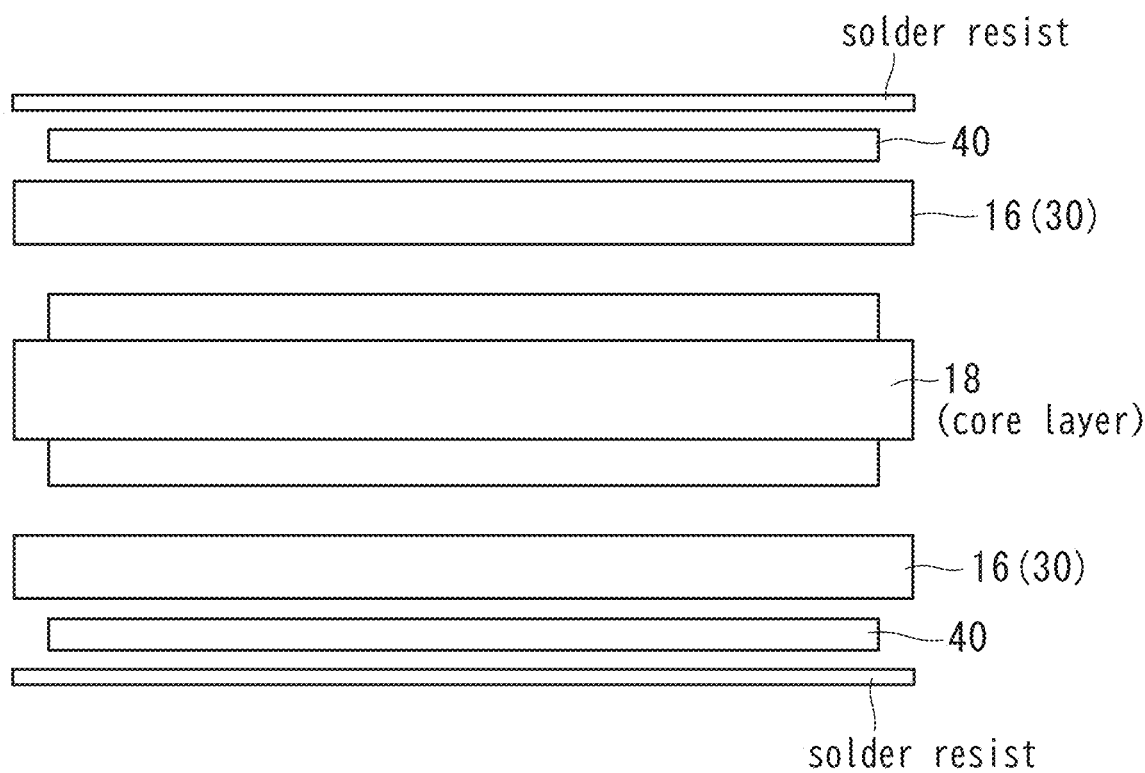

The printed wiring board 10 according to the present invention is described mainly using FIG. 1 and FIG. 2. FIG.

1 depicts sectional views of the printed wiring board in a vertical direction. FIG. 2 depicts sectional view of a prepreg layer 12 in a horizontal direction.

The printed wiring board 10 refers to a board having a wiring of an electric circuit printed on the surface of or inside the board formed of an insulator, and is also referred to as a raw board.

Embodiment 1

The printed wiring board 10 according to the present invention has the prepreg layer 12 including a cloth-like material 26 woven of reinforced fiber 20 and a metal layer 14 formed on a surface of the prepreg layer 12.

The prepreg layer 12 is formed of a prepreg 30 including the cloth-like material 26 woven of the reinforced fiber 20, and the prepreg 30 is formed of a sheet material 16.

The prepreg 30 is a sheet-shaped reinforced plastic molded material by uniformly impregnating a fiber-like reinforcing material, such as a glass cloth or carbon fiber, with a thermosetting resin such as epoxy mixed with an additive such as a curing agent or adhesive agent and heating or drying the resultant material into a semi-cured state.

The prepreg 30 is often formed in a square or rectangular shape in plan view, and includes outer edges such as an upper end edge 12a, a left end edge 12b, a lower end edge 12c, and a right end edge 12d. When the prepreg 30 has a quadrate shape in plan view, the upper end edge 12a and the lower end edge 12c are parallel to each other, and the left end edge 12b and the right end edge 12d are parallel to each other.

The sheet material 16 is woven with an angle between a warp thread 22, which is a thread in a longitudinal direction, and a weft tread 24, which is a thread in a lateral direction, if a woven fabric (cloth-like material 26) woven of the reinforced fiber 20 being 90 degrees, and configures a mother laminate (copper-clad laminate 50) as an inner-layer board or an insulating board.

In the sheet material 16 of the mother laminate (copper-clad laminate 50), threads configuring the cloth-like material 26 are cut so that one side of a circumferential edge portion of the sheet material 16 is tilted either one of leftward and rightward at an angle equal to or larger than 5 degrees and equal to or smaller than 30 degrees and a length of a cut portion obtained by cutting out the cloth-like-material configuration threads (warp threads 22 and weft threads 24) aligned on a cutting blade 100 with the cutting blade 100 is longer by 0.3 mm to 6.3 mm than a total length of a clearance between an upper blade 102 and a lower blade 104 configuring the cutting blade 100 for cutting the cloth-like material 26 and a thickness of the cloth-like-material configuration threads (warp threads 22 and weft threads 24) of the sheet material 16 aligned on the cutting blade 100, the circumferential edge portion of the mother laminate (copper-clad laminate 50) is cut, and the threads configuring the cloth-like material 26 of the sheet material 16 are cut. The sheet material 16 is also characterized in that the metal layer 14 is formed on a surface of the sheet material 16, and a conductor pattern is formed on the metal layer 14.

The mother laminate (copper-clad laminate 50) is a board before a circuit is printed.

The mother laminate (copper-clad laminate 50) is a laminate obtained by bring a thin conductor material (copper foil) 40 into full contact with the prepreg 30, heating the resultant material to a curing temperature by pressing (pressurizing), and interposing the prepreg 30 and a core material 18 between the CCL (copper-clad laminate 50) obtained by curing the prepreg 30 and another similar CCL (copper-clad laminate 50), heating and pressurizing the resultant material to cure the prepreg 30 and laminate the CCL.

An insulating board obtained by stacking a sheet (prepreg 30) impregnating a base material such as paper or glass with resin and perform heating and pressurizing the resultant material is referred to as a laminate, and the CCL (copper-clad laminate 50) is one obtained by providing a copper foil (metal layer 14) on both surfaces of that laminate.

The prepreg layer 12 configures an insulating sheet (layer), and the metal layer 14 configures a conductor sheet (layer).

The prepreg layer 12, the metal layer 14, and the core material 18 having the conductor material (copper foil) 40 (metal layer 14) laminated on both surfaces of the board are laminated, and a conductor pattern 80 (such as a wiring pattern) is formed on the conductor material (copper foil) 40 (metal layer 14).

The prepreg layer 12 is configured of the prepreg 30, which is the sheet material 16, having the cloth-like material 26 woven into a cloth shape by taking the warp threads 22 and the weft threads 24 configured of the reinforced fiber 20 as threads in the longitudinal direction and threads in the lateral direction, respectively, and a resin layer 28 formed by impregnating the cloth-like material 26 with resin. To improve the strength of the printed wiring board 10, a plurality of prepreg layers 30 may be laminated.

The prepreg 30, which is the sheet material 16, configuring the prepreg layer 12 is often formed in a square or rectangular shape in plan view, and includes outer edges such as an upper end edge 12a, a left end edge 12b, a lower end edge 12c, and a right end edge 12d.

When the sheet material 16 configured of the prepreg 30 has a quadrate shape in plan view, the sheet material includes an upper end edge 16a, a left end edge 16b, a lower end edge 16c, and a right end edge 16d, and the upper end edge 16a and the lower end edge 16c are parallel to each other and the left end edge 16b and the right end edge 16d are parallel to each other.

The reinforced fiber 20 is made broadly of organic fiber and inorganic fiber.

Examples of inorganic fiber include glass fiber and carbon fiber. Example of organic fiber include aramid fiber and so forth.

There are various forms of fiber, such as long fiber for use as it is and short fiber for use by cutting into several millimeters to several tens of millimeters.

The reinforced fiber 20 is formed by twisting a plurality of fibers into a thread. For example, the diameter of each glass fiber is 9 µm, and approximately 400 glass fibers are twisted by tension into a thread. A reinforcing material 26 is woven by using threads of the reinforced fiber 20 in the longitudinal direction and in the lateral direction as the warp threads 22 and the weft threads 24, respectively. The warp threads 22 and the weft threads 24 are used to make plain weave, twill weave, and so forth, into a cloth shape for use.

The reinforced fiber 20 of the warp threads 22 and the weft threads 24 is woven by using long fiber (such as plain weave or twill weave). The weft threads 24 made of the reinforced fiber 20 have a direction extending an up-down direction (for example, a vertical direction), and the warp threads 22 made of the reinforced fiber 20 have a direction extending a left-right direction (for example, a horizontal direction).

The extending direction of the warp threads 22 and the extending direction of the weft threads 24 are configured so as to be orthogonal to or intersect each other.

As the resin for use in the resin layer 28, for example, a thermosetting resin is used, for example, epoxy resin or phenol resin. The resin layer 28 is formed by impregnating the reinforcing material 26 with the above-described resin.

In the sheet material 16 configuring the prepreg layer 12, when viewed in plan view (refer to FIG. 1), an angle formed by the upper end edge 16*a* and the warp thread 22 at a point of intersection of the upper end edge 16*a* and the warp thread 22 is equal to or larger than 5 degrees and equal to or smaller than 30 degrees.

In the sheet material 16 configuring the prepreg layer 12, when viewed in plan view (refer to FIG. 1), an angle formed by the left end edge 16*b* and the weft thread 24 at a point of intersection of the left end edge 16*b* and the weft thread 24 is equal to or larger than 5 degrees and equal to or smaller than 30 degrees.

In this embodiment, the warp threads 22 and the weft threads 24 configuring the reinforced fiber 20 are configured so that an extending direction of the reinforced fiber 20 with respect to a cutting line corresponding to the extending direction of the cutting blade 100 for cutting the sheet material 16 configuring the prepreg layer 12 into a predetermined shape so as to correspond to the shape of the printed wiring board 10 has an angle equal to or larger than 5 degrees and equal to or smaller than 30 degrees.

That is, the warp threads 22 and the weft threads 24 configuring the reinforced fiber 20 are formed so as to allow the cutting blade 100 for cutting when the printed wiring board 10 is formed into a predetermined shape to shear in a direction crossing the fiber configuring the warp threads 22 and the weft threads 24 at a predetermined angle (equal to or larger than 5 degrees and equal to or smaller than 30 degrees).

With this, when a printed wiring board of any size is formed to have an outer shape in a predetermined shape and a through hole formed therein, the weft threads 24 and/or the warp threads 22 can be cut, and the occurrence of fiber waste at the time of cutting can be suppressed. Thus, a soldering defect due to fiber waste can be suppressed.

In this embodiment, as depicted in FIG. 1, the prepreg 30 has a square shape in plan view, and is formed so that, considering as a plane including two straight lines when the lines are crossing, an angle formed by the warp thread 22 configuring the prepreg 30 as the sheet material 16 and the lower end edge 12*c* of the prepreg 30 as the sheet material 16, that is, an angle formed by two straight lines obtained by moving in parallel a straight line extending in parallel with the fiber direction of the warp thread 22 to a position of crossing a straight line extending in parallel with the lower end edge 12*c* of the prepreg 30, the angle formed by the two crossing straight lines being taken as an angle formed by the original two straight lines, is 13.05 degrees.

Figure 3:
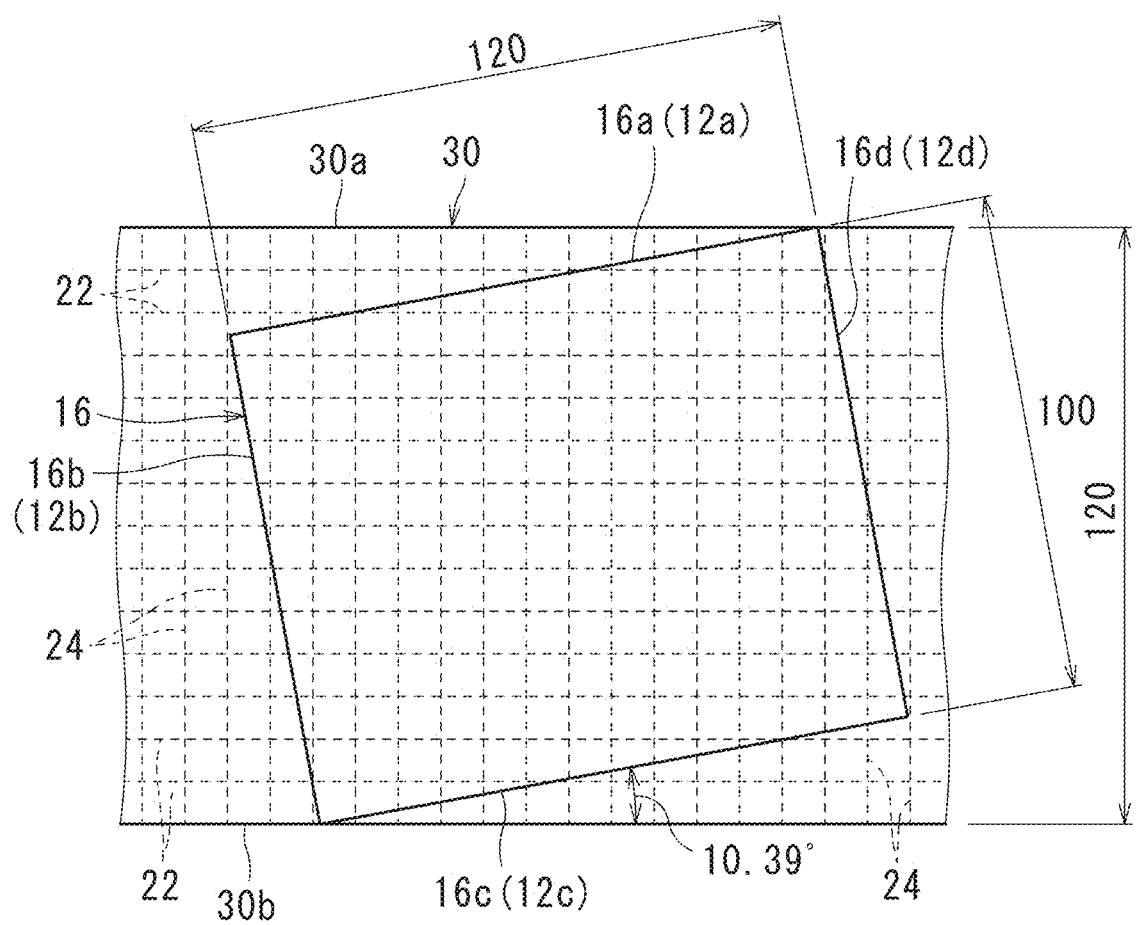
FIG. 3 is a plan view depicting a process of forming the sheet material from the prepreg.

Also, in this embodiment, as depicted in FIG. 3, the prepreg 30 as the sheet material 16 has a rectangular shape in plan view, and is formed so that, considering as a plane including two straight lines when the lines are crossing, an angle formed by the weft thread 24 configuring the prepreg 30 and the lower end edge 12*c* of the prepreg 30 as the sheet material 16, that is, an angle formed by two straight lines obtained by moving in parallel a straight line extending in parallel with the fiber direction of the weft thread 24 to a position of crossing a straight line extending in parallel with the lower end edge 12*c* of the prepreg 30, the angle formed by the two crossing straight lines being taken as an angle formed by the original two straight lines, is 13.39 degrees.

With this, the weft thread 24 and the warp thread 22 can be cut when a printed wiring board of any size is cut out, and the occurrence of fiber waste can be suppressed. Therefore, a soldering defect due to fiber waste can be suppressed.

The metal layer 14 is formed of, for example, a conductor material 40 such as a copper foil. The copper foil normally has a thickness on the order of 18 μm to 70 μm.

Normally, the copper foil is subjected to roughening, and asperities on the order of 5 μm to 7 μm are formed on one surface (adhesive surface) of the copper foil.

The prepreg 30 is configured so that the asperities on the surface of the copper foil are embedded between the warp threads 22 and the weft threads 24 configuring the reinforcing material 26 and in the fiber configuring the warp threads 22 and the weft threads 24 to allow the reinforcing material 26 and the copper foil to become in full contact with each other.

A wiring pattern of the printed wiring board 10 is printed on the metal layer (copper foil layer) surface of the mother laminate 50 by screen printing or the like and etched, thereby forming the conductor pattern 80.

The printed wiring board 10 with the wiring pattern formed thereon can be brought into conduction by soldering electronic components (not depicted) and so forth on the conductor pattern 80.

On the metal layer (copper foil layer) 14 surface of the mother laminate 50 with the conductor material 40 configuring the metal layer (copper foil layer) 14 laminated on the prepreg 30 as the insulating sheet material, a circuit pattern of a corrosion-resistant film is formed by screen printing or photoresist, and copper of a non-image area is dissolved and removed with an etchant. Next, the corrosion-resistant film is removed with an alkaline aqueous solution or the like to create the conductor pattern 80 of an electric circuit or the like.

Figure 4A:
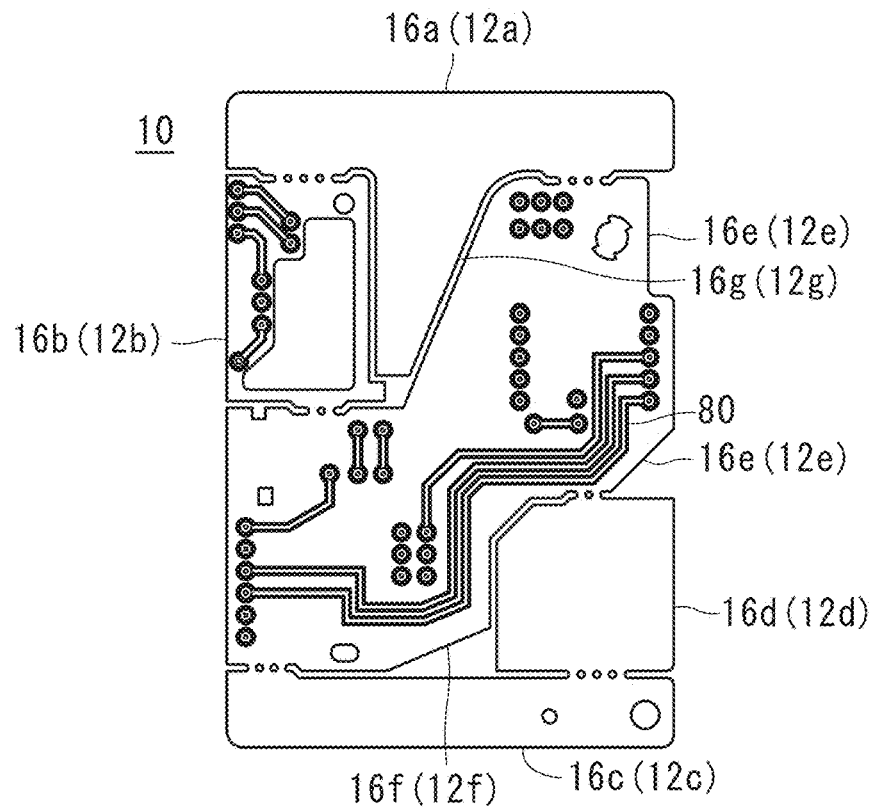
Figure 4B:
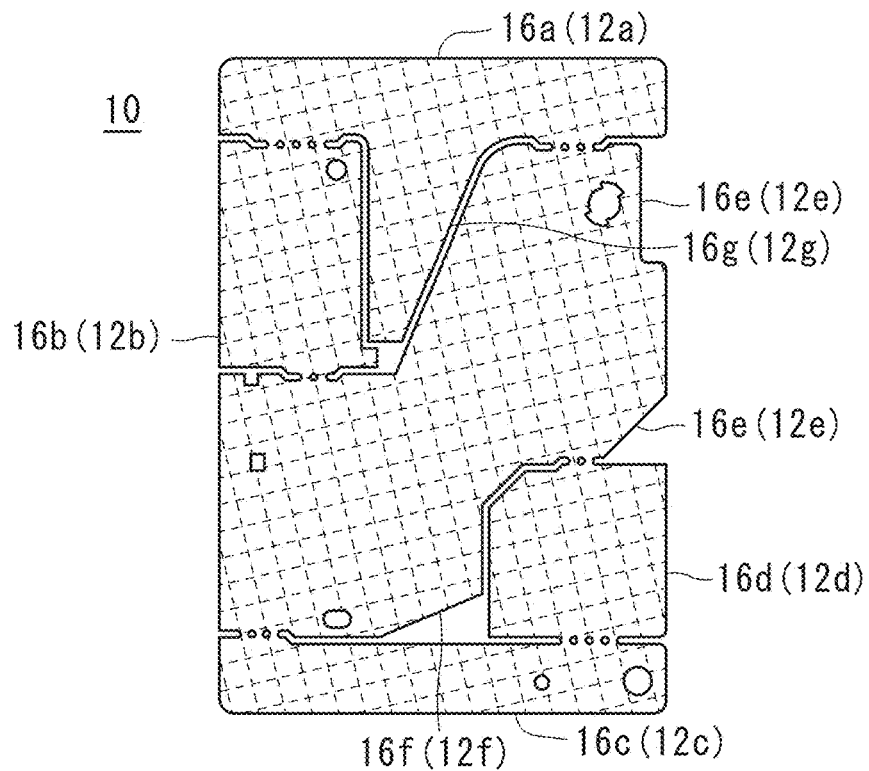

This printed wiring board 10 may include, as depicted in FIG. 4, a complicated shape such as an uneven shape 12*e* where the outer shape of the copper-clad laminate (mother laminate) 50 is recessed into the inside of the outer edge, and a relatively large through hole 12*f*, a long narrow hole 12*g*.

When even the printed wiring board 10 having this complicated shape is cut by the upper blade 102 and the lower blade 104 of the cutting blade 100 for forming end edges (upper end edge 52*a*, left end edge 52*b*, lower end edge 52*c*, right end edge 52*d*, and uneven shape 52*e*) configuring the outer shape of the copper-clad laminate (mother laminate) 50 and through holes (52*f*, 52*g*), cutting can be made not in an extending direction of the warp threads 22 and the weft threads 24 configuring the reinforced fiber but in a direction orthogonal to or crossing the directions in which the warp threads 22 and the weft threads 24 extend. Thus, the occurrence of fiber waste can be suppressed.

Figure 15:
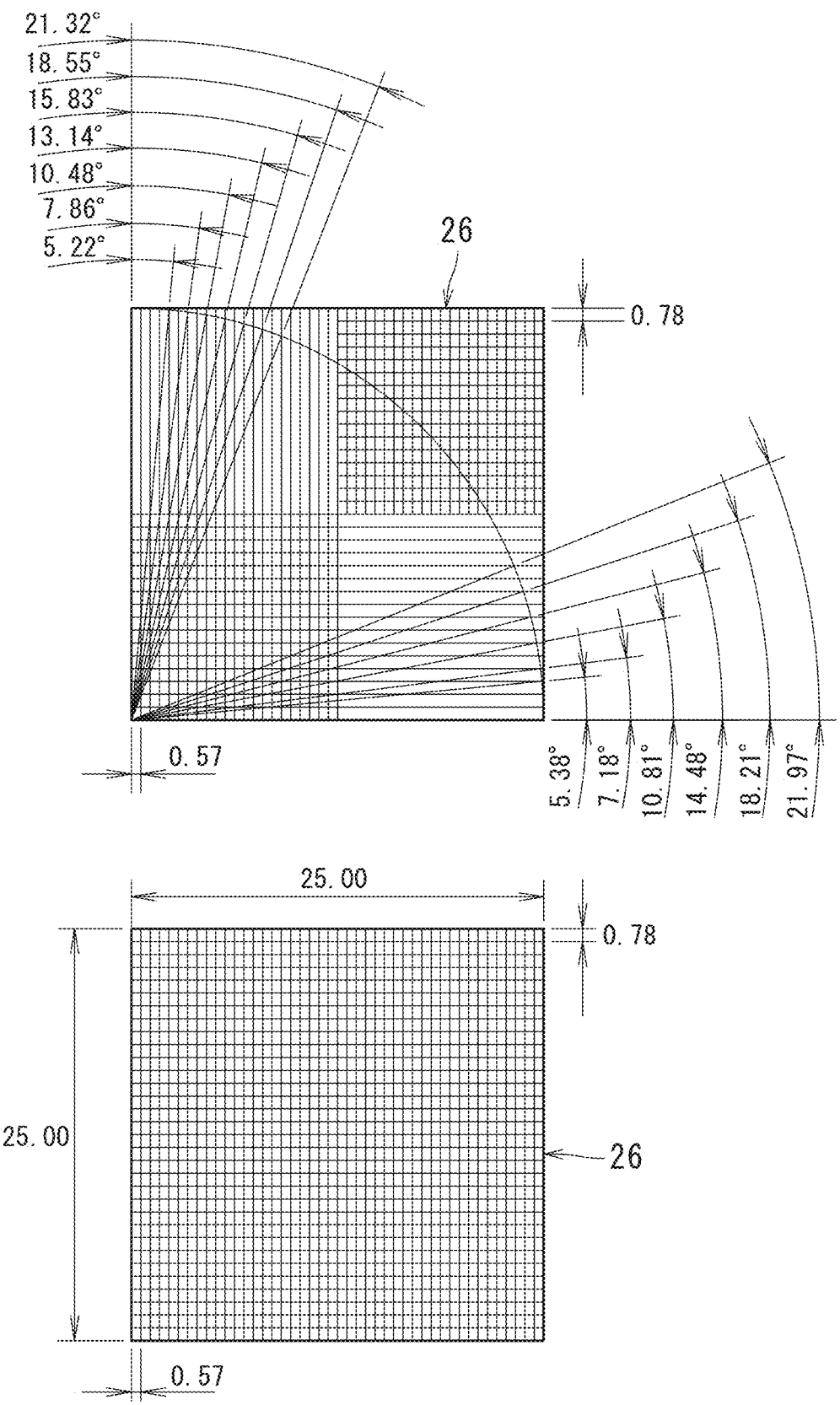
FIG. 15 is a diagram depicting a tilt angle which allows fuzzing to be decreased when reinforced fiber is cut.

As depicted in FIG. 15, when cutting is made with the cutting blade tilted with respect to the warp threads and the weft threads of the cloth-like material configuring the sheet material, the fiber of the reinforced fiber can be reliably cut, and fuzzing can be prevented.

When cutting is made with the cutting blade tilted with an angle equal to or larger than 5.38 degrees and equal to or smaller than 30 degrees with respect to the weft threads, the fiber (weft threads) of the reinforced fiber can be reliably cut.

Also, when cutting is made with the cutting blade tilted with an angle equal to or larger than 5.22 degrees and equal to or smaller than 30 degrees with respect to the warp threads, the fiber (warp threads) of the reinforced fiber can be reliably cut.

Embodiment 2

Figure 7A:
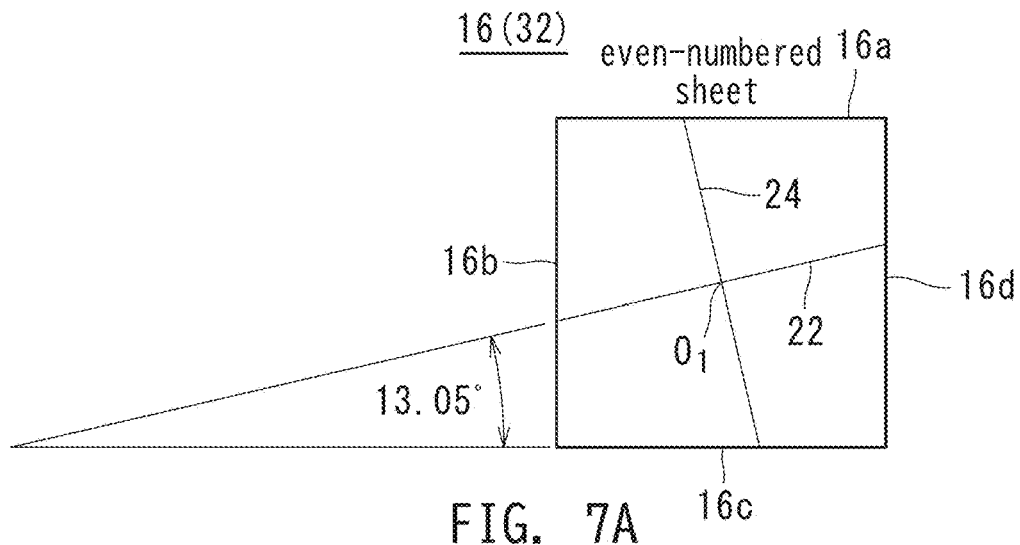
FIG. 7A, FIG. 7B and FIG. 7C are diagrams depicting a method of forming a plurality of layers of prepregs with a reverse bias.
Figure 7B:
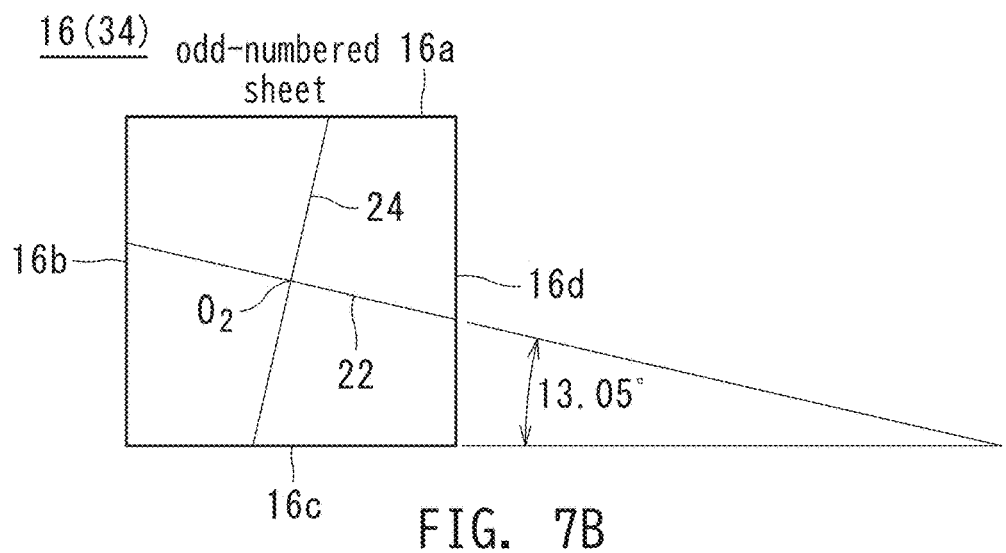
Figure 7C:
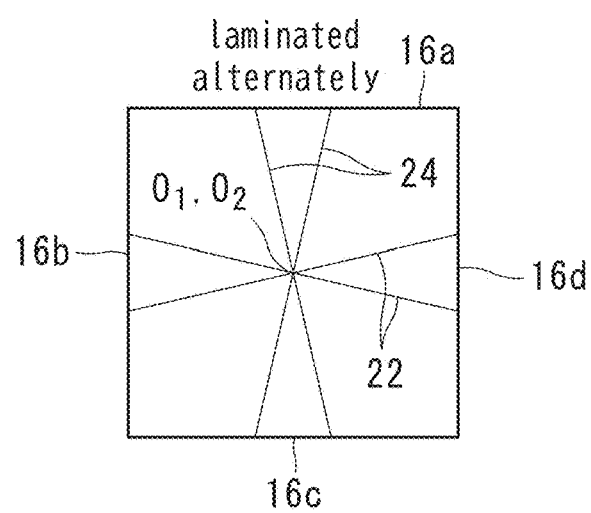

Next, a printed wiring board 10 of Embodiment 2 is described, based mainly on FIG. 5 to FIG. 7.

This printed wiring board 10 is characterized in that the reinforced fiber configuring the prepreg layer 12 is obtained by laminating sheet materials 16 with fiber directions of two types, with their fiber directions of the reinforced fiber being made different from each other to form a reverse bias.

The structure of the prepreg layer 12 formed by laminating the prepreg 30 is different from that of the printed wiring board 10 of Embodiment 1.

A sheet material 16A and a sheet material 16B for lamination are laminated so that the directions in which the warp threads 22 and the weft threads 24 of the cloth-like material 26 of the prepreg 30 extend form a reverse bias.

In this printed wiring board 10, the sheet material 16 has the first sheet material 16A and the second sheet material 16B, the first sheet material 16A is woven so that an angle between the warp thread 22 and the weft thread 24 of the reinforced fiber 20 is 90 degrees, and the reinforced fiber 20 is cut so that the warp thread 22 or the weft thread 24 forms a degree equal to or larger than 6 degrees and equal to or smaller than 45 degrees on one side of a circumferential edge of the first sheet material 16A, the second sheet material 16B is woven so that an angle between the warp thread 22 and the weft thread 24 of the reinforced fiber 20 is 90 degrees, and the reinforced fiber 20 is cut so that the warp thread 22 or the weft thread 24 forms a degree equal to or larger than 6 degrees and equal to or smaller than 45 degrees on one side of a circumferential edge of the second sheet material 16B, and this printed wiring board has the first sheet material 16A and the second sheet material 16B alternately laminated with different fiber directions.

An odd layer 32 and an even layer 34 are laminated, the odd layer 32 with first warp threads 22 and first weft threads 24 of the cloth-like material 26 configuring the first sheet material 16A rotated counterclockwise at an angle equal to or larger than 5 degrees and equal to or smaller than 30 degrees in plan view, and the even layer 34 with second warp threads 22 and second weft threads 24 of the cloth-like material 26 configuring the second sheet material 16B rotated clockwise at an angle equal to or larger than 5 degrees and equal to or smaller than 30 degrees in plan view are laminated.

The first warp threads 22 and the first weft threads 24 of the cloth-like material 26 of the first sheet material 16A are orthogonal, the second warp threads 22 and the second weft threads 24 of the cloth-like material 26 of the second sheet material 16B are orthogonal. When these first sheet material 16A and second sheet material 16B are laminated, a point of intersection O1 of the first warp thread 22 and the first weft thread 24 of the cloth-like material 26 of the first sheet material 16A and a point of intersection O2 of the second warp thread 22 and the second weft thread 24 of the cloth-like material 26 of the second sheet material 16B are matched, and the first sheet material 16A is rotated to a counterclockwise direction at a predetermined angle, and the second sheet material 16B is rotated to a clockwise direction at a predetermined angle.

In this embodiment, it is formed so that, considering as a plane including two straight lines when the lines are crossing, an angle formed by the first warp thread 22 of the cloth-like material 26 configuring the first sheet material 16A and the lower end edge 16c of the first sheet material 16A, that is, an angle formed by two straight lines obtained by moving in parallel a straight line extending in parallel with the extending direction of the first warp thread 22 of the cloth-like material 26 of the first sheet material 16A to a position of crossing a straight line extending in parallel with the lower end edge of the first sheet material 16A, the angle formed by the two crossing straight lines being taken as an angle formed by the original two straight lines, is 13.05 degrees.

In this embodiment, it is formed so that, an angle formed by the second warp thread 22 of the cloth-like material 26 configuring the second sheet material 16B and the lower end edge of the second sheet material 16B, that is, an angle formed by two straight lines obtained by moving a straight line extending in parallel with the extending direction of the second warp thread 22 of the cloth-like material 26 of the second sheet material 16B to a position of crossing a straight line extending in parallel with the lower end edge 16c of the second sheet material 16B, the angle formed by the two crossing straight lines being taken as an angle formed by the original two straight lines, is 13.05 degrees.

2. Printed Wiring Board Manufacturing Method

The printed wiring board 10 according to the present invention is manufactured by using, for example, any of manufacturing methods according to Example 1 to Example 4 below.

In the following, a method of Embodiment 1 for manufacturing the printed wiring board 10 according to the present invention is described by using mainly FIG. 8A to FIG. 10.

The printed wiring board manufacturing method according to the present invention includes:

a step (S11) of preparing the sheet material 16 including the cloth-like material 26 woven of the reinforced fiber 20 with an angle between the warp thread 22 and the weft thread 24 of the reinforced fiber being 90 degrees;

a step (S12) of arranging the sheet material 16 on the cutting-out apparatus 120 so that the sheet material 16 is tilted either one of leftward and rightward at an angle equal to or larger than 5 degrees and equal to or smaller than 30 degrees with respect to the threads (warp threads 22 or weft threads 24) configuring the cloth-like material 26 of the sheet material 16 and a cut portion 110 is cut so as to cross the cloth-like-material configuration threads (warp threads 22 or weft threads 24) aligned on the cutting blade 100 at an angle equal to or larger than 5 degrees and equal to or smaller than 30 degrees;

a step (S13) of cutting out the sheet material 16 from the tilted sheet material 16 with the cut portion 110 crossing the cloth-like-material configuration threads (warp threads 22 or weft threads 24) aligned on the cutting blade 100 at an angle equal to or larger than 5 degrees and equal to or smaller than 30 degrees to form the sheet material 16 with a circumferential edge portion of the sheet material 16 crossing the cloth-like material configuration threads (warp threads 22 or weft threads 24) at an angle equal to or larger than 5 degrees and equal to or smaller than 30 degrees;

a step (S14) of creating the mother laminate 50 configured with the sheet material 16 as an inner-layer board or an insulating board;

a step (S15) of forming the metal layer 14 on a surface of the mother laminate 50; and a step (S16) of providing the conductor pattern 80 on the metal layer 14 of the mother laminate 50 along a circumferential edge portion of the mother laminate 50.

Example 1

The printed wiring board 10 according to the present invention is manufactured by a "method of tilting and cutting the sheet material" below depicted mainly on FIGS. 8A and 8B.

The printed wiring board manufacturing method according to the present invention includes:

a step (S11) of preparing the sheet material 16 including the cloth-like material 26 woven of the reinforced fiber 20 with an angle between the warp thread 22 and the weft thread 24 of the reinforced fiber being 90 degrees;

a step (S12) of arranging the sheet material 16 on the cutting-out apparatus 120 so that the sheet material 16 is tilted either one of leftward and rightward at an angle equal to or larger than 5 degrees and equal to or smaller than 30 degrees with respect to the threads (warp threads 22 or weft threads 24) configuring the cloth-like material 26 of the sheet material 16 and a cut portion 110 is cut so as to cross the cloth-like-material configuration threads (warp threads 22 or weft threads 24) aligned on the cutting blade 100 at an angle equal to or larger than 5 degrees and equal to or smaller than 30 degrees;

a step (S13) of cutting out the sheet material 16 from the tilted sheet material 16 with the cut portion 110 crossing the cloth-like-material configuration threads (warp threads 22 or weft threads 24) aligned on the cutting blade 100 at an angle equal to or larger than 5 degrees and equal to or smaller than 30 degrees to form the sheet material 16 with a circumferential edge portion of the sheet material 16 crossing the cloth-like material configuration threads (warp threads 22 or weft threads 24) at an angle equal to or larger than 5 degrees and equal to or smaller than 30 degrees;

a step (S14) of creating the mother laminate 50 configured with the sheet material 16 as an inner-layer board or an insulating board;

a step (S15) of forming the metal layer 14 on a surface of the mother laminate 50; and a step (S16) of providing the conductor pattern 80 on the metal layer 14 of the mother laminate 50 along a circumferential edge portion of the mother laminate 50.

First, an original sheet of cloth-like-material 26A serving as the cloth-like material 26 configuring the prepreg 30 is applied and impregnated with resin (for example, epoxy resin) to form the prepreg 30 having the resin layer 28 with resin cured to become semi-cured. The prepreg 30 is manufactured into a sheet shape forming the prepreg layer 12 (S11).

The original sheet of cloth-like-material 26A extends to be elongated in a transfer direction of the cloth-like material 26, and an upper end edge 26Aa and a lower end edge 26Ac extending in the transfer direction of the cloth-like material 26 are parallel to each other in a belt shape.

The original sheet of cloth-like-material 26A (cloth-like material) is impregnated with resin, and a sheet-like material (cloth-like material) with its upper and lower surfaces covered with thin resin includes the belt-shaped, linear upper end edge 26Aa and lower end edge 26Ac.

Here, the warp threads 22 and the weft threads 24 of the reinforced fiber 20 configuring the original sheet of cloth-like-material 26A are orthogonal to or cross each other.

Next, the prepreg 30 including the sheet-like material (cloth-like material) is cut into a predetermined size to form the sheet material 16 (S12).

Here, the sheet-like material (cloth-like material) configuring the prepreg 30 is set in a cutting apparatus 120 so that, by adjusting a positional relation between the upper blade 102 and the lower blade 104 of the cutting blade 100 provided to a stamping apparatus and the prepreg 30, an angle formed by a linear portion of the blade extending in a longitudinal direction of the cutting blade (upper blade 102 and lower blade 104) of the cutting blade 100 and the extending direction of the warp threads 22 or the weft threads 24 is equal to or larger than 5 degrees and equal to or smaller than 30 degrees (S12).

Furthermore, a case is described in which the sheet-like material (cloth-like material) is stamped to manufacture the sheet material 16 configured of the prepreg 30.

A "method of tilting and cutting the sheet material" according to the present invention includes a step of cutting the sheet material 16 from the tilted sheet material 16 with the cut portion 110 crossing the cloth-like-material configuration threads (warp threads 22 or weft threads 24) aligned on the cutting blade 100 at an angle equal to or larger than 5 degrees and equal to or smaller than 30 degrees to form the sheet material 16 with a circumferential edge portion of the sheet material 16 crossing the cloth-like material configuration threads (warp threads 22 or weft threads 24) at an angle equal to or larger than 5 degrees and equal to or smaller than 30 degrees, and the step is described below.

It is configured that, when a sheet-like material (that is, prepreg 30) obtained by impregnating the original sheet of cloth-like-material 26A (cloth-like material) with resin and having its upper and lower surfaces covered with thin resin is cut, the sheet-like material (that is, prepreg 30) is cut by the upper blade 102 and the lower blade 104 of the cutting blade 100 for cutting into a quadrate shape as being tilted at an angle equal to or larger than 5 degrees and equal to or smaller than 30 degrees with respect to linear upper end edge 30a and lower end edge 30b of the sheet-like material (that is, prepreg 30) to form the sheet material 16 configured with the prepreg 30.

Furthermore, a case is described in which the cut sheet-like material (that is, prepreg 30) is stamped to form the sheet material 16 into a quadrate shape.

When a sheet-like material (that is, prepreg 30) obtained by impregnating the original sheet of cloth-like-material 26A (reinforced fiber 20) with resin and having its upper and lower surfaces covered with thin resin is cut into a quadrate shape, the sheet-like material (that is, prepreg 30) is cut so as to be orthogonal to linear right end edge 16d and left end edge 16b of the sheet material 16 to form the sheet material 16 in a quadrate shape having the upper end edge 16a and the lower end edge 16c orthogonal to the right end edge 16d and the left end edge 16b (S13).

In this embodiment, when the sheet material 16 serving as the square-shaped prepreg 30 is formed, the sheet material is arranged and cut so that the upper end edge 26Aa and the lower end edge 26Ac extending in the transfer direction of the original sheet of cloth-like-material 26A diagonally cross the upper blade 102 and the lower blade 104 of the cutting blade 100 at an angle of 13.05 degrees. Also, when the sheet material 16 serving as the rectangular-shaped prepreg 30 is formed, the sheet material is arranged and cut so that they diagonally cross the upper blade 102 and the lower blade 104 of the cutting blade 100 at an angle of 10.39 degrees.

Next, a method of forming the copper-clad laminate (mother laminate) 50 by laminating the sheet materials 16 is described.

For the purpose of improving strength of the printed wiring board 10, a plurality of sheet materials 16 configuring the prepreg layer 12 are laminated (S14).

Also, as depicted in FIG. 2, the prepregs 30 as insulating materials are laminated on both upper and lower surfaces of the core material 18 forming the copper-clad laminate (mother laminate) 50 to interpose the core material 18 therebetween, and may each have a copper foil configuring the conductor material (copper foil) 40 laminated thereon (S15).

On each of the upper and lower surfaces of the core material 18 serving as a board inner layer, a copper foil is affixed from the beginning, and is subjected to etching to form an inner-layer pattern.

Next, a conductor material (copper foil) 40 configured with the metal (for example, a copper foil) is mounted on one surface or both surfaces of the sheet material 16 configuring the prepreg layer 12, and is subjected to heat curing as being pressed (S14).

When the sheet material 16 and the conductor material (copper foil) 40 as being laminated are put into a vacuum oven 180 for heat pressurizing, resin is cured, and a laminate in a multilayer structure including the sheet material 16 and the conductor material (copper foil) 40 is obtained. With this, the copper-clad laminate 50 can be obtained.

Next, the obtained copper-clad laminate 50 is set on the cutting-out apparatus 120 such as a servo press machine (S14).

Lastly, stamping is performed by the cutting-out apparatus 120. With this, the printed wiring board 10 is shaped by removing an unnecessary portion so that the printed wiring board 10 of a desired size can be obtained.

As a method of forming the printed wiring board 10 from the copper-clad laminate 50, there is a method as depicted in FIGS. 8A to 8D.

Figure 8A:
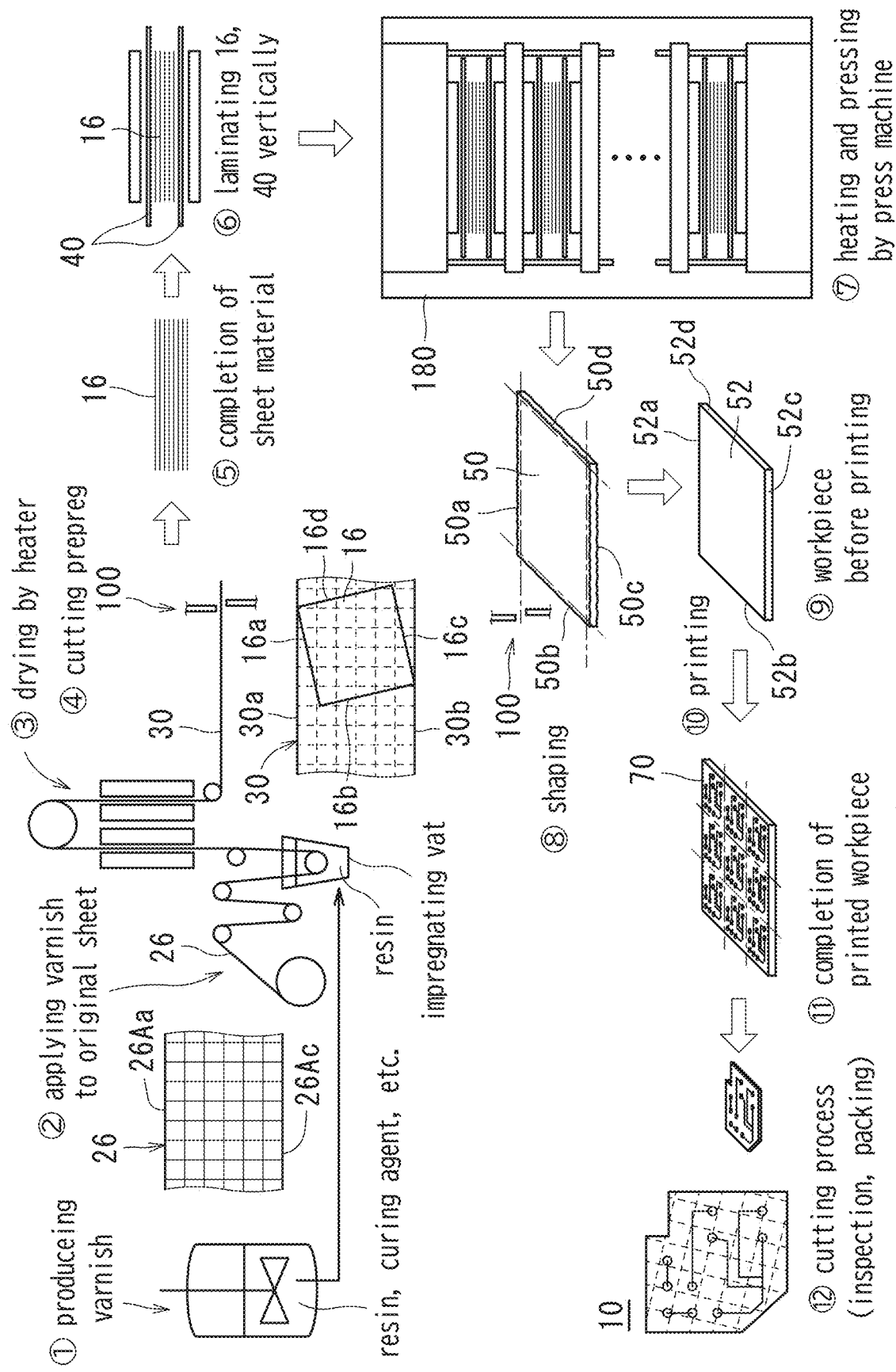
FIG. 8A is a diagram depicting a method of manufacturing the printed wiring board.
Figure 8D:
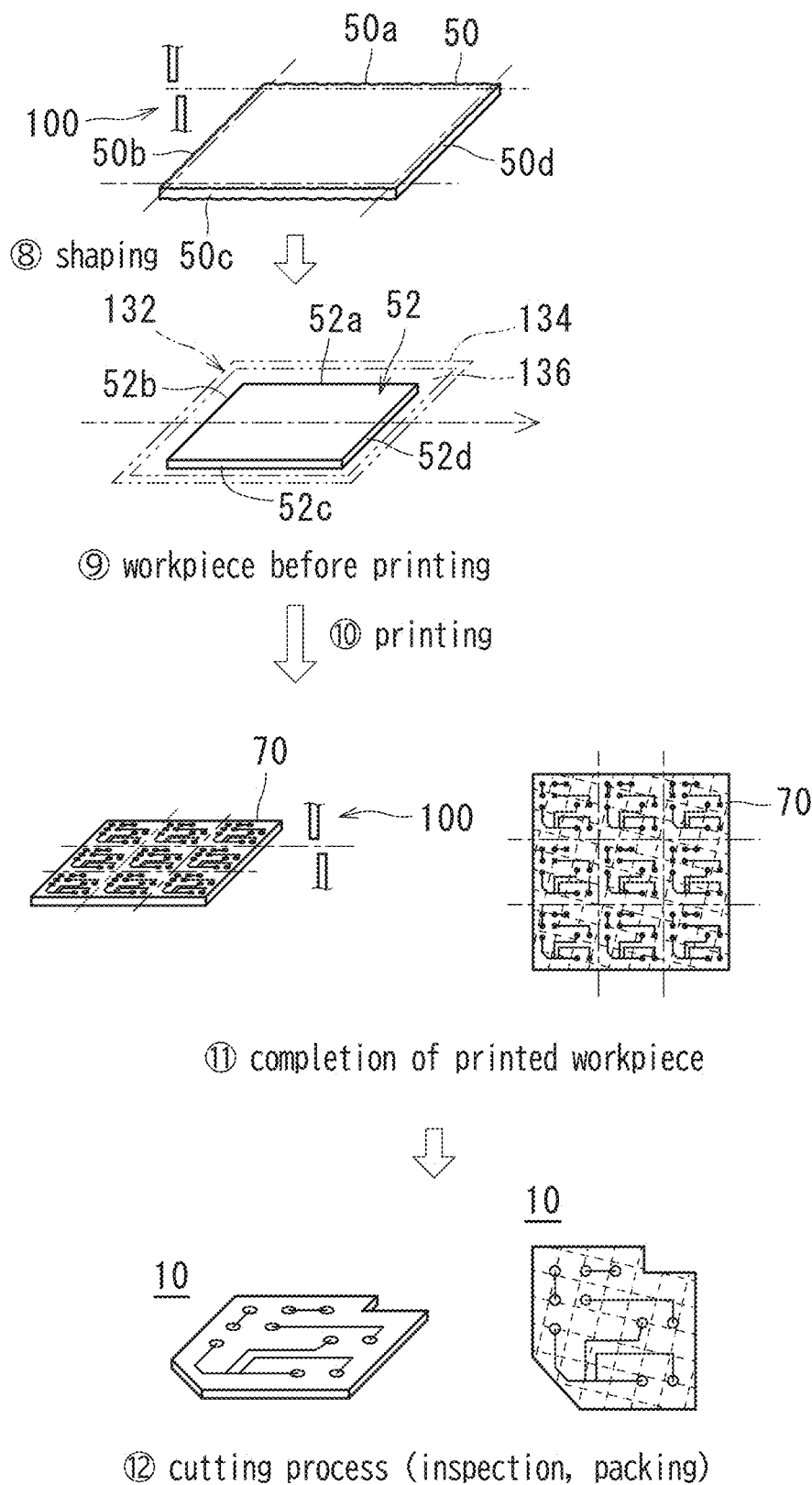
FIG. 8D is a perspective view depicting the method of forming a printed wiring board from a copper-clad laminate.

To allow a plurality of printed wiring boards 10 to be created from the copper-clad laminate (mother laminate) 50 formed by heating and pressurizing by the press machine, the copper-clad laminate (mother laminate) 50 formed by heating and pressurizing by the press machine is cut into the shape of a printed wiring board to form a workpiece 52, and then the workpiece 52 is subjected to printing of the conductor pattern 80 and so forth required for the printed wiring board (refer to FIGS. 8A and 8D).

A case in which the conductor pattern 80 is formed on the workpiece 52 is described based mainly on FIG. 8D.

A screen printing plate 132 for forming the conductor pattern 80 on the workpiece 52 is formed by stretching a screen gauze 136 over a frame body 134 with tension.

At the time of printing, screen printing is performed by disposing the screen printing plate 132 on a printing surface of the workpiece 52 in parallel with an end edge of that frame body 134 and an end edge of the workpiece 52 (S16).

With this, a printed workpiece 70 with the conductor pattern 80 printed thereon is formed on the surface of the workpiece 52.

As a method of printing an electric circuit on the copper-clad laminate (mother laminate) 50, platemaking and printing techniques as described below are used for creation.

On the conductor material (copper foil) 40 surface of the copper-clad laminate (mother laminate) 50 having the conductor material (copper foil) 40 for forming the metal layer (copper foil layer) 14 laminated on the prepreg 30 as the insulating material, a circuit pattern of a corrosion-resistant film is formed by screen printing or photoresist, copper of a non-image area is dissolved and removed with an etchant, and the corrosion-resistant film is next removed with an alkaline aqueous solution or the like to create an electric circuit.

Next, a solder resist is formed as required.

The solder resist is formed, with its surface coated, so that after the etching step is completed and the conductor pattern 80 is formed, only copper of a necessary portion is exposed.

The solder resist plays a role of preventing attachment of solder to an unnecessary portion.

The solder resist is formed by using ink, liquid resist, a dry film, or the like, depending on the technique.

Next, a case in which the printed wiring board 10 is formed by cutting the printed workpiece 70 is described based mainly on FIG. 8D.

The printed workpiece 70 is disposed between the upper blade 102 and the lower blade 104 of the cutting blade 100 so as to be orthogonal to an end edge of the printed workpiece 70 and the extending direction of the upper blade 102 and the lower blade 104 of the cutting blade 100, and the printed workpiece 70 is cut by the cutting blade 100 in a direction orthogonal to the end edge of the printed workpiece 70.

The printed workpiece is cut in a direction orthogonal to the upper end edge 52*a* and the lower end edge 52*c* of the workpiece 52, and is further cut in a direction orthogonal to the left end edge 52*b* and the right end edge 52*d* of the workpiece 52 to form the printed wiring board 10 in an approximately quadrate shape.

Figure 16A:
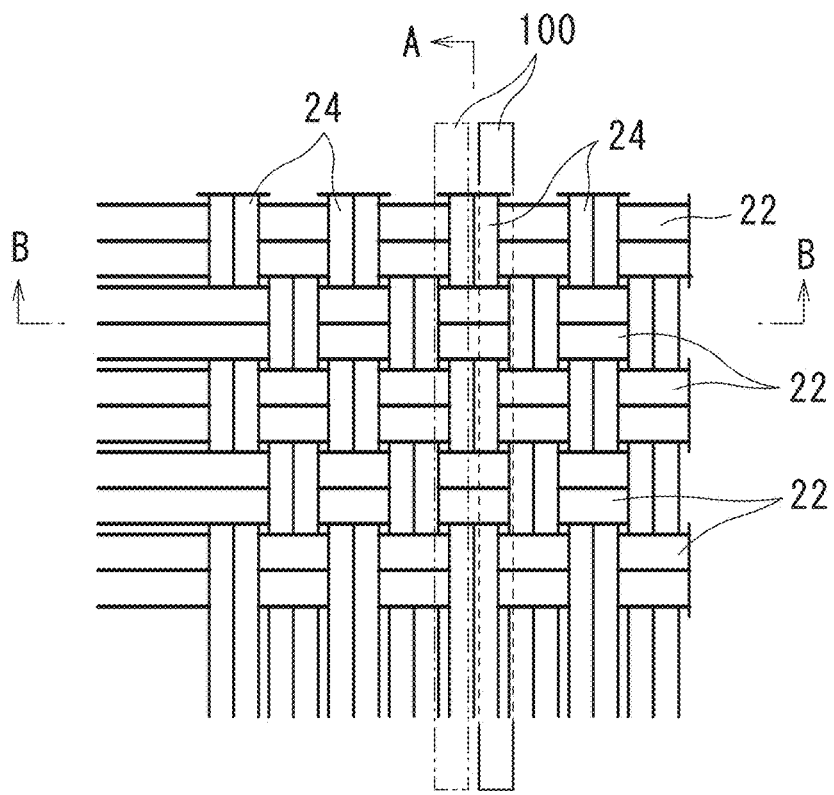
Figure 16B:
Figure 16C:
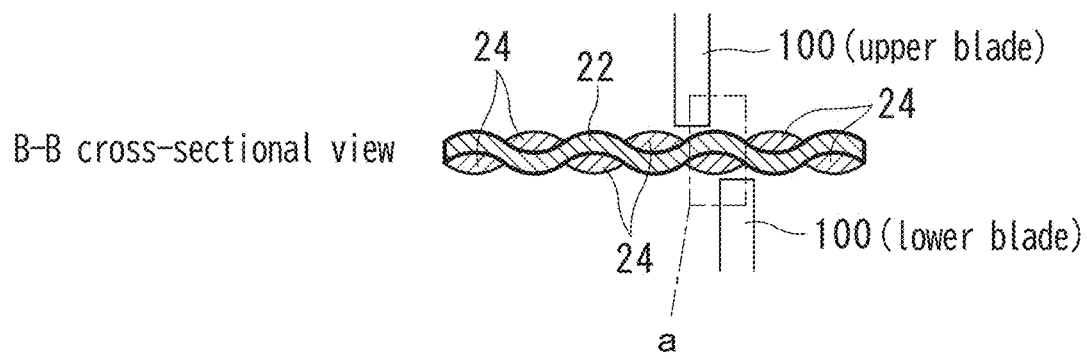

Here, as for Example 1, unlike a case in which the cutting blade 100 is in a direction parallel to the fiber direction of the weft threads 24 and orthogonal to the fiber direction of the warp threads 22 as depicted in FIG. 16 (comparative example), Examples 1-1 to 1-10 in which the cutting blade is tilted at a tilt angle of 5 degrees to 30 degrees are described as depicted in FIG. 8C.

Figure 17A:
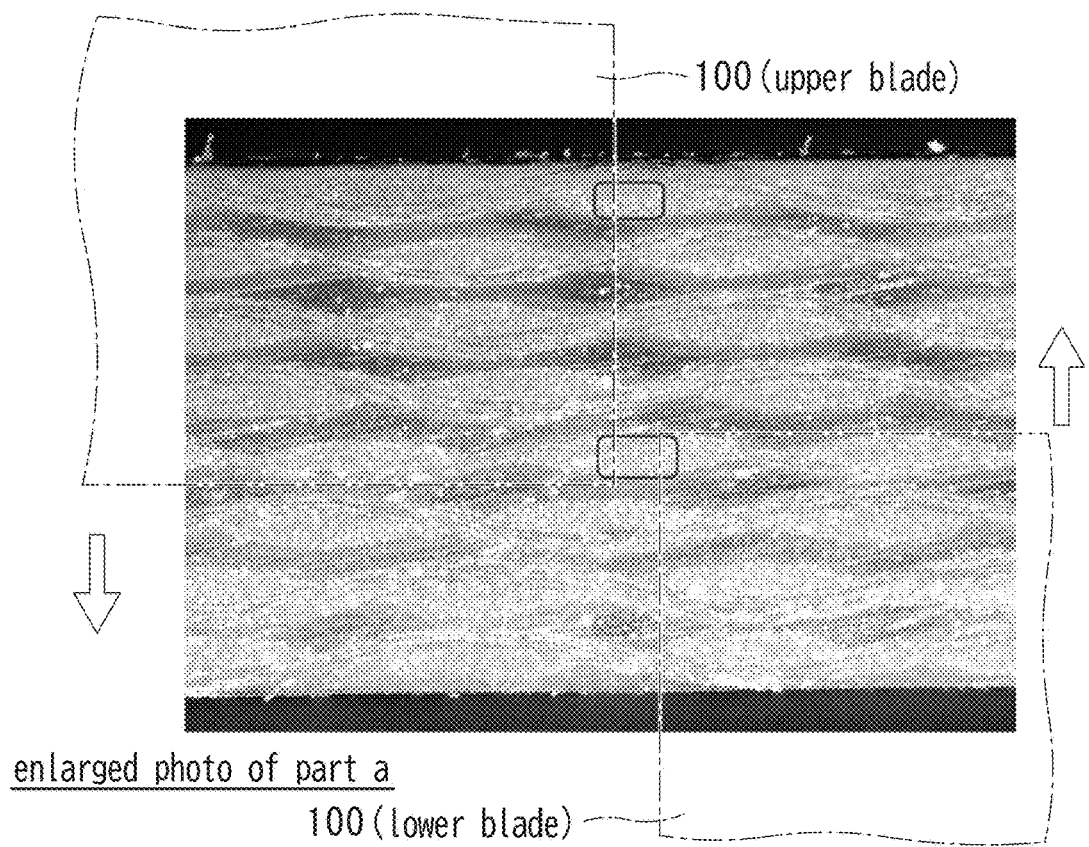
FIG. 17A is a sectional view depicting the relation between the cutting blade and the warp threads and the weft threads of the cloth-like material.
Figure 17B:
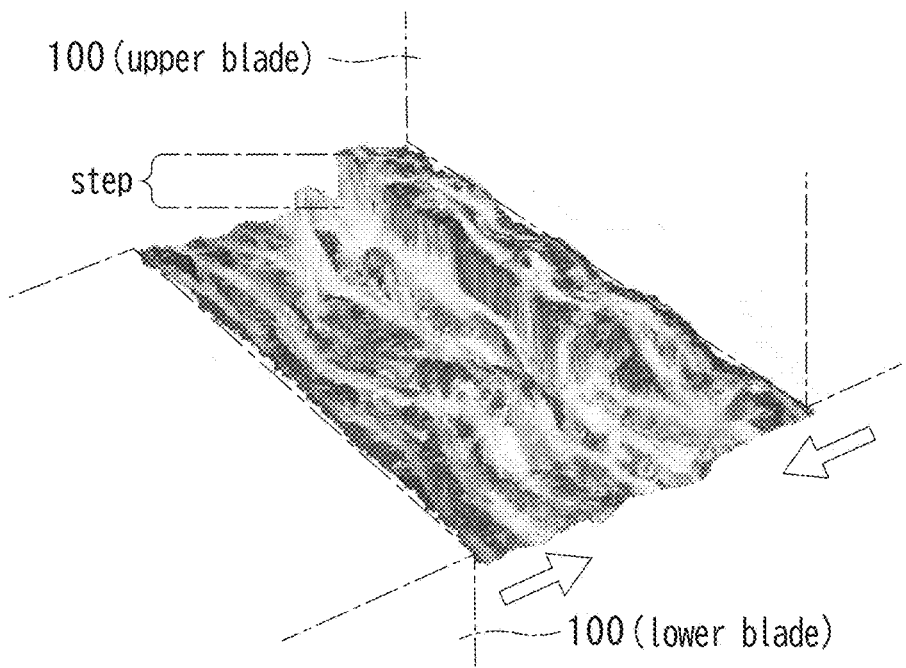
FIG. 17B is an enlarged view of the cut cloth-like material.
Figure 18A:
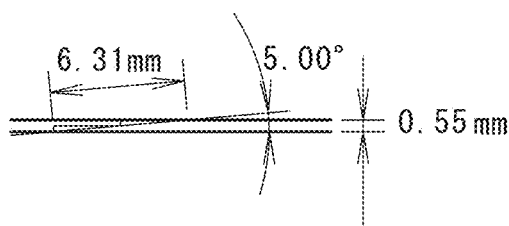
FIG. 18A depicts a diagram depicting the tilt angle of the cutting blade and the warp threads and the weft threads of the cloth-like material in Example 1-1 and Example 1-6, and an enlarged sectional observation photograph of the state of fiber of the cut cloth-like material.
Figure 18A:
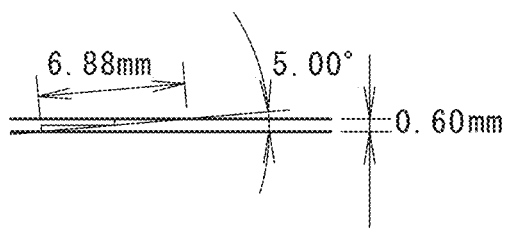
Figure 18A:
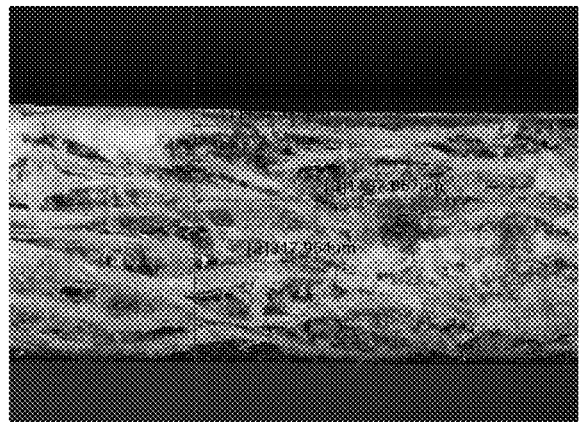
Figure 18A:
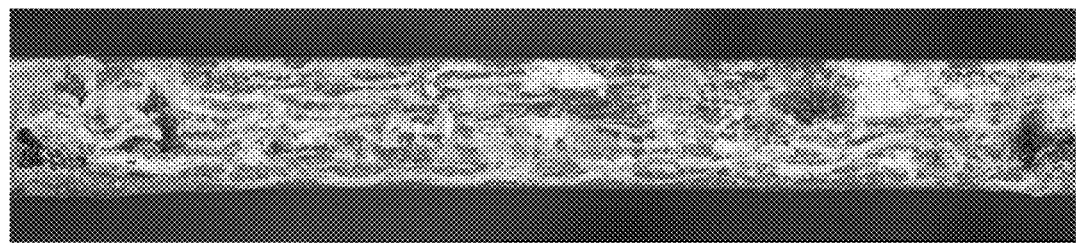
Figure 18B:
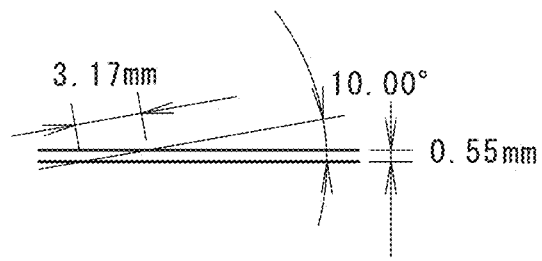
FIG. 18B depicts a diagram depicting the tilt angle of the cutting blade and the warp threads and the weft threads of the cloth-like material in Example 1-2 and Example 1-7, and an enlarged sectional observation photograph of the state of fiber of the cut cloth-like material.
Figure 18B:
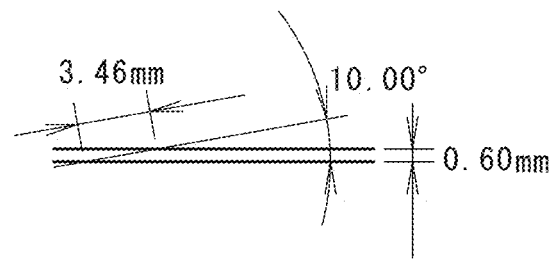
Figure 18B:
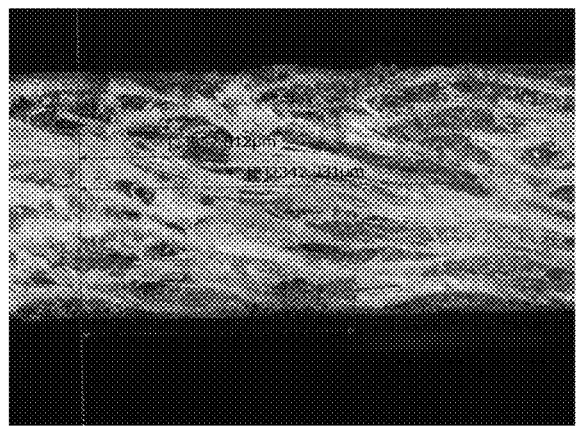
Figure 18B:
Figure 18C:
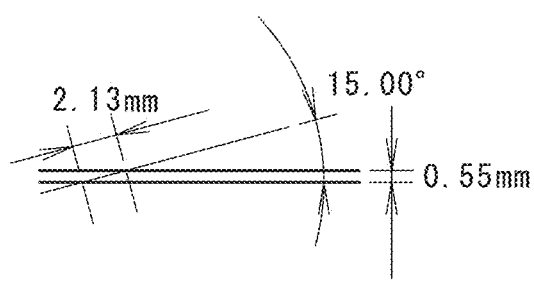
FIG. 18C depicts a diagram depicting the tilt angle of the cutting blade and the warp threads and the weft threads of the cloth-like material in Example 1-3 and Example 1-8, and an enlarged photograph of the state of fiber of the cut cloth-like material.
Figure 18C:
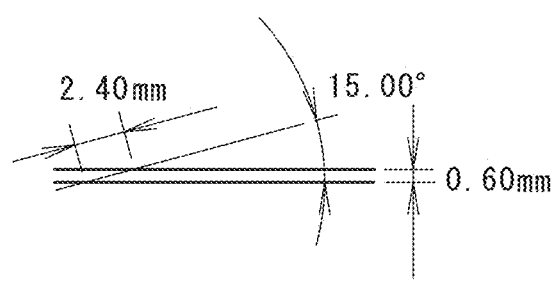
Figure 18C:
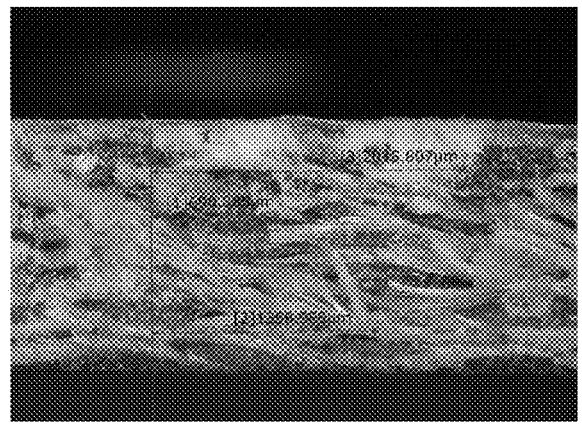
Figure 18C:
Figure 18D:
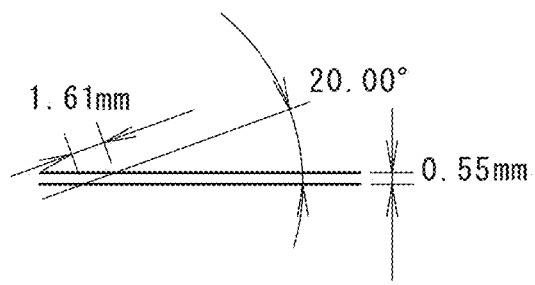
FIG. 18D depicts a diagram depicting the tilt angle of the cutting blade and the warp threads and the weft threads of the cloth-like material in Example 1-4 and Example 1-9, and an enlarged sectional observation photograph of the state of fiber of the cut cloth-like material.
Figure 18D:
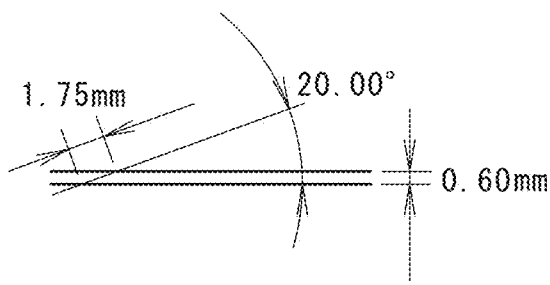
Figure 18D:
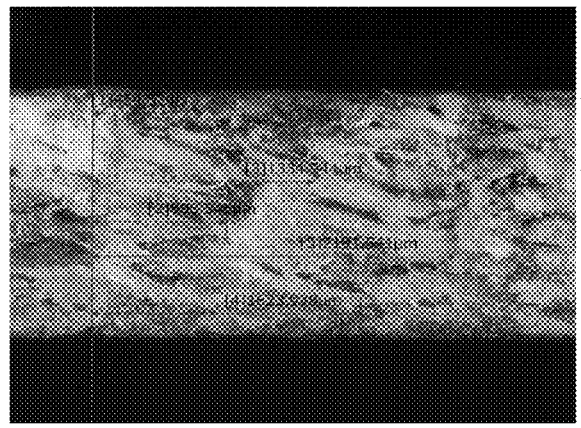
Figure 18D:
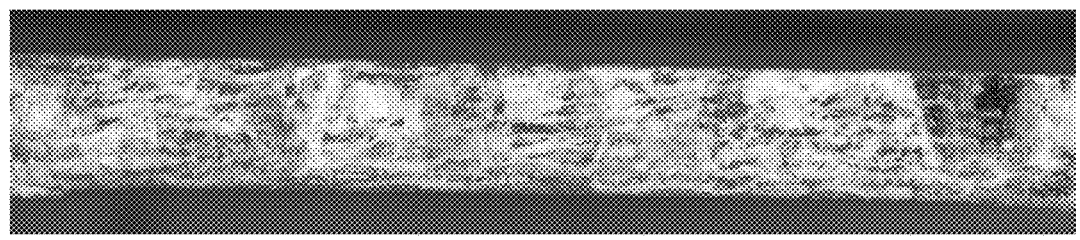
Figure 18E:
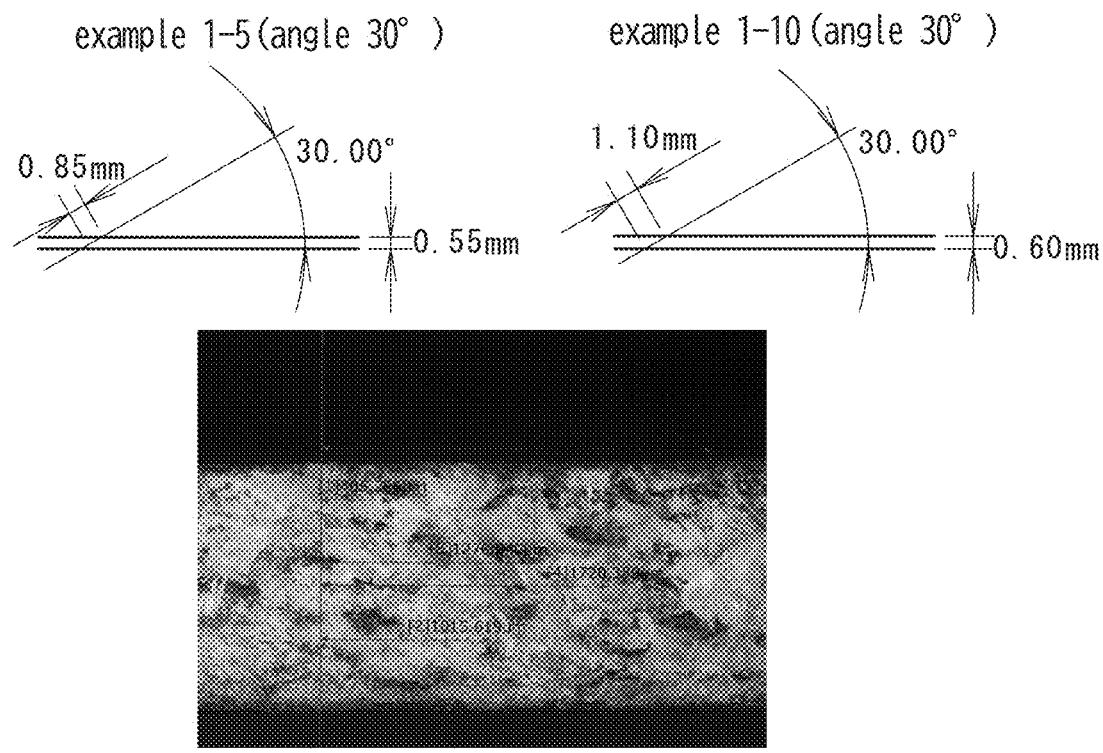
FIG. 18E depicts a diagram depicting the tilt angle of the cutting blade and the warp threads and the weft threads of the cloth-like material in Example 1-5 and Example 1-10, and an enlarged sectional observation photograph of the state of fiber of the cut cloth-like material.
Figure 18F:
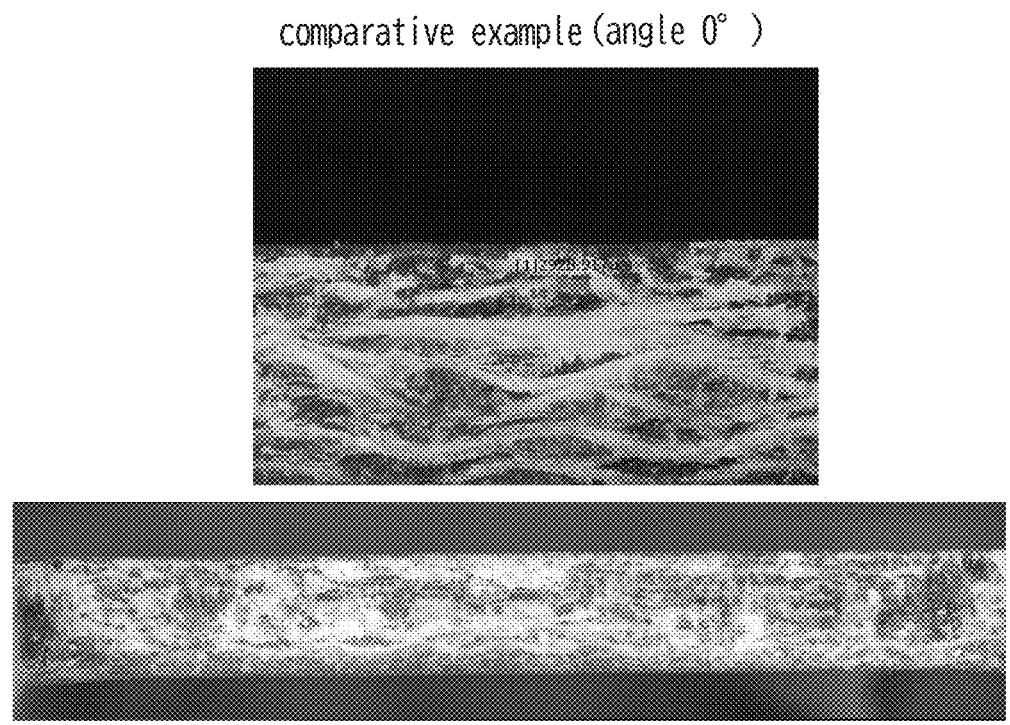
FIG. 18F is an enlarged sectional observation photograph of the state of fiber of the cut cloth-like material in a comparative example.
Figure 19:
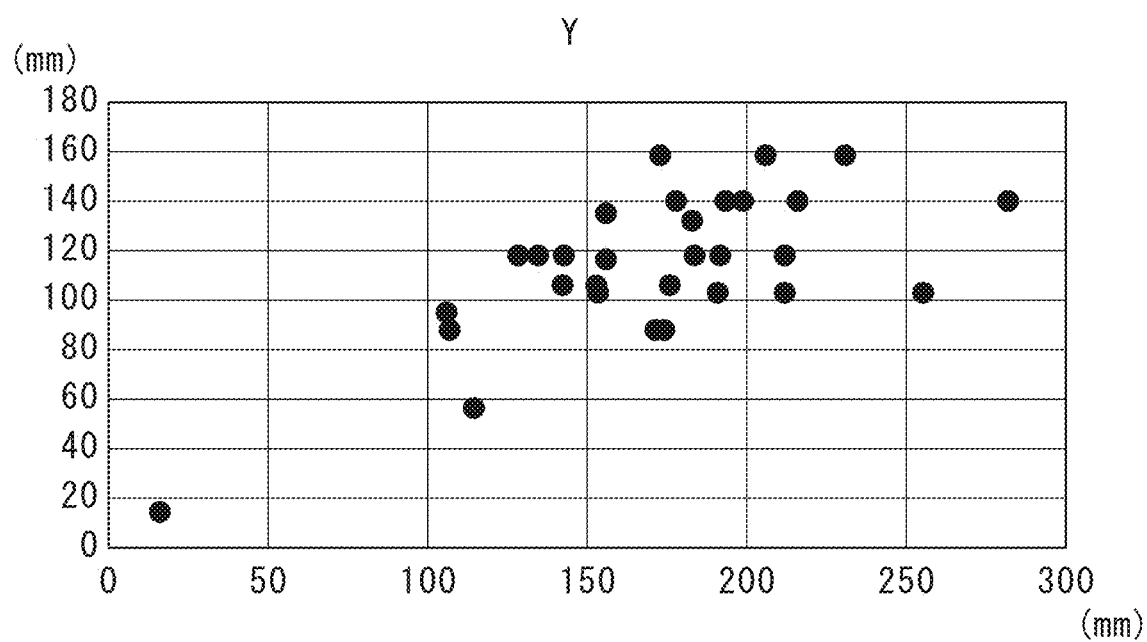
FIG. 19 is a graph depicting a distribution of product sizes of a manufacturer which concerns fiber falling of printed wiring boards.

In the comparative example, as depicted in FIG. 17, a step occurs in a fiber portion parallel to the cutting blade, and a portion is observed in which fiber protrudes from a section of a fiber portion orthogonal to the cutting blade (refer to FIG. 17 and FIG. 18F).

Sectional observation photographs (FIGS. 18A to 18E) are enlarged photographs of the cloth-like material cut with the angle changed by a cutting machine of a shearing cut type.

When these are observed, a fiber piece with both ends cut does not occur but peeling of fiber slightly occurs in Examples 1-1 and 1-6.

In Examples 1-2 and 1-7, 1-3 and 1-8, 1-4 and 1-9, and 1-5 and 1-10, when a section of the cut fiber is observed, peeling of fiber does not occur and the state is stable.

In Examples 1-1 to 1-10, a step or protruding portion of fiber as that in the comparative example is not observed (refer to FIGS. 18A, 18B, 18C, 18D, and 18E).

Example 1-1

When the diameter of the warp thread or the weft thread of the cloth-like material configuring the sheet material was 0.55 mm and cutting is performed by the cutting blade tilted as described below, the length of a cut portion is longer than the diameter of the warp thread or the weft thread as described below, and the length of the cut portion has the following multiplying factor with respect to the diameter of the warp thread and the weft thread.

1. Diameter of Warp Thread or Weft Thread: 0.55 mm
   1.1 Tilt Angle Between Cutting Blade and Warp Thread or Weft Thread: 5 degrees
   1.2 Length of Cut Portion Longer Than Diameter of Warp Thread or Weft Thread: 6.3 mm
   1.3 Multiplying Factor When Length of Cut Portion Is Longer Than Diameter of Warp Thread and Weft Thread: Multiplying factor of 11.47

Example 1-2

When the diameter of the warp thread or the weft thread of the cloth-like material configuring the sheet material is 0.55 mm and cutting is performed by the cutting blade tilted as described below, the length of a cut portion is longer than the diameter of the warp thread or the weft thread as described below, and the length of the cut portion has the following multiplying factor with respect to the diameter of the warp thread and the weft thread.

2. Diameter of Warp Thread or Weft Thread: 0.55 mm
   2.1 Tilt Angle Between Cutting Blade and Warp Thread or Weft Thread: 10 degrees
   2.2 Length of Cut Portion Longer Than Diameter of Warp Thread or Weft Thread: 2.62 mm
   2.3 Multiplying Factor When Length of Cut Portion Is Longer Than Diameter of Warp Thread and Weft Thread: Multiplying factor of 5.76

Example 1-3

When the diameter of the warp thread or the weft thread of the cloth-like material configuring the sheet material is 0.55 mm and cutting is performed by the cutting blade tilted as described below, the length of a cut portion is longer than the diameter of the warp thread or the weft thread as described below, and the length of the cut portion has the following multiplying factor with respect to the diameter of the warp thread and the weft thread.

3. Diameter of Warp Thread or Weft Thread: 0.55 mm
   3.1 Tilt Angle Between Cutting Blade and Warp Thread or Weft Thread: 15 degrees
   3.2 Length of Cut Portion Longer Than Diameter of Warp Thread or Weft Thread: 1.58 mm
   3.3 Multiplying Factor When Length of Cut Portion Is Longer Than Diameter of Warp Thread and Weft Thread: Multiplying factor of 3.87

Example 1-4

When the diameter of the warp thread or the weft thread of the cloth-like material configuring the sheet material is 0.55 mm and cutting is performed by the cutting blade tilted as described below, the length of a cut portion is longer than the diameter of the warp thread or the weft thread as described below, and the length of the cut portion has the following multiplying factor with respect to the diameter of the warp thread and the weft thread.

4. Diameter of Warp Thread or Weft Thread: 0.55 mm
   4.1 Tilt Angle Between Cutting Blade and Warp Thread or Weft Thread: 20 degrees
   4.2 Length of Cut Portion Longer Than Diameter of Warp Thread or Weft Thread: 1.06 mm
   4.3 Multiplying Factor When Length of Cut Portion Is Longer Than Diameter of Warp Thread and Weft Thread: Multiplying factor of 2.92

Example 1-5

When the diameter of the warp thread or the weft thread of the cloth-like material configuring the sheet material is 0.55 mm and cutting is performed by the cutting blade tilted as described below, the length of a cut portion is longer than the diameter of the warp thread or the weft thread as described below, and the length of the cut portion has the following multiplying factor with respect to the diameter of the warp thread and the weft thread.

5. Diameter of Warp Thread or Weft Thread: 0.55 mm
   5.1 Tilt Angle Between Cutting Blade and Warp Thread or Weft Thread: 30 degrees
   5.2 Length of Cut Portion Longer Than Diameter of Warp Thread or Weft Thread: 0.3 mm
   5.3 Multiplying Factor When Length of Cut Portion Is Longer Than Diameter of Warp Thread and Weft Thread: Multiplying factor of 1.54

Example 1-6

When the diameter of the warp thread or the weft thread of the cloth-like material configuring the sheet material is 0.60 mm and cutting is performed by the cutting blade tilted as described below, the length of a cut portion is longer than the diameter of the warp thread or the weft thread as described below, and the length of the cut portion has the following multiplying factor with respect to the diameter of the warp thread and the weft thread.

6. Diameter of Warp Thread or Weft Thread: 0.60 mm
   6.1 Tilt Angle Between Cutting Blade and Warp Thread or Weft Thread: 5 degrees
   6.2 Length of Cut Portion Longer Than Diameter of Warp Thread or Weft Thread: 6.28 mm
   6.3 Multiplying Factor When Length of Cut Portion Is Longer Than Diameter of Warp Thread and Weft Thread: Multiplying factor of 11.46

Example 1-7

When the diameter of the warp thread or the weft thread of the cloth-like material configuring the sheet material is 0.60 mm and cutting is performed by the cutting blade tilted as described below, the length of a cut portion is longer than the diameter of the warp thread or the weft thread as described below, and the length of the cut portion has the following multiplying factor with respect to the diameter of the warp thread and the weft thread.

7. Diameter of Warp Thread or Weft Thread: 0.60 mm
   7.1 Tilt Angle Between Cutting Blade and Warp Thread or Weft Thread: 10 degrees
   7.2 Length of Cut Portion Longer Than Diameter of Warp Thread or Weft Thread: 2.86 mm
   7.3 Multiplying Factor When Length of Cut Portion Is Longer Than Diameter of Warp Thread and Weft Thread: Multiplying factor of 5.77

Example 1-8

When the diameter of the warp thread or the weft thread of the cloth-like material configuring the sheet material is 0.60 mm and cutting is performed by the cutting blade tilted as described below, the length of a cut portion is longer than the diameter of the warp thread or the weft thread as described below, and the length of the cut portion has the following multiplying factor with respect to the diameter of the warp thread and the weft thread.

8. Diameter of Warp Thread or Weft Thread: 0.60 mm
8.1 Tilt Angle Between Cutting Blade and Warp Thread or Weft Thread: 15 degrees
8.2 Length of Cut Portion Longer Than Diameter of Warp Thread or Weft Thread: 1.8 mm
8.3 Multiplying Factor When Length of Cut Portion Is Longer Than Diameter of Warp Thread and Weft Thread: Multiplying factor of 4.00

Example 1-9

When the diameter of the warp thread or the weft thread of the cloth-like material configuring the sheet material is 0.60 mm and cutting is performed by the cutting blade tilted as described below, the length of a cut portion is longer than the diameter of the warp thread or the weft thread as described below, and the length of the cut portion has the following multiplying factor with respect to the diameter of the warp thread and the weft thread.
9. Diameter of Warp Thread or Weft Thread: 0.60 mm
9.1 Tilt Angle Between Cutting Blade and Warp Thread or Weft Thread: 20 degrees
9.2 Length of Cut Portion Longer Than Diameter of Warp Thread or Weft Thread: 1.15 mm
9.3 Multiplying Factor When Length of Cut Portion Is Longer Than Diameter of Warp Thread and Weft Thread: Multiplying factor of 2.92

Example 1-10

When the diameter of the warp thread or the weft thread of the cloth-like material configuring the sheet material is 0.60 mm and cutting is performed by the cutting blade tilted as described below, the length of a cut portion is longer than the diameter of the warp thread or the weft thread as described below, and the length of the cut portion has the following multiplying factor with respect to the diameter of the warp thread and the weft thread.
10. Diameter of Warp Thread or Weft Thread: 0.60 mm
10.1 Tilt Angle Between Cutting Blade and Warp Thread or Weft Thread: 30 degrees
10.2 Length of Cut Portion Longer Than Diameter of Warp Thread or Weft Thread: 0.5 mm
10.3 Multiplying Factor When Length of Cut Portion Is Longer Than Diameter of Warp Thread and Weft Thread: Multiplying factor of 1.83

Comparative Example 1

When the diameter of the warp thread or the weft thread of the cloth-like material configuring the sheet material is 0.55 mm and cutting is performed in a direction orthogonal to the cutting blade and a longitudinal end edge of the fiber, the length of a cut portion is equal to the diameter of the warp thread or the weft thread as described below, and the length of the cut portion has the following multiplying factor with respect to the diameter of the warp thread and the weft thread.
1. Diameter of Warp Thread or Weft Thread: 0.55 mm
1.1 Tilt Angle Between Cutting Blade and Warp Thread or Weft Thread: 0 degree
1.2 Length of Cut Portion Longer Than Diameter of Warp Thread or Weft Thread: 0 mm
1.3 Multiplying Factor When Length of Cut Portion Is Longer Than Diameter of Warp Thread and Weft Thread: Multiplying factor of 0

Comparative Example 2

When the diameter of the warp thread or the weft thread of the cloth-like material configuring the sheet material is 0.60 mm and cutting is performed in a direction orthogonal to the cutting blade and a longitudinal end edge of the fiber, the length of a cut portion is equal to the diameter of the warp thread or the weft thread as described below, and the length of the cut portion has the following multiplying factor with respect to the diameter of the warp thread and the weft thread.
6. Diameter of Warp Thread or Weft Thread: 0.60 mm
6.1 Tilt Angle Between Cutting Blade and Warp Thread or Weft Thread: 0 degree
6.2 Length of Cut Portion Longer Than Diameter of Warp Thread or Weft Thread: 0 mm
6.3 Multiplying Factor When Length of Cut Portion Is Longer Than Diameter of Warp Thread and Weft Thread: Multiplying factor of 0

3. Other Printed Wiring Board Manufacturing Method

Figure 9:
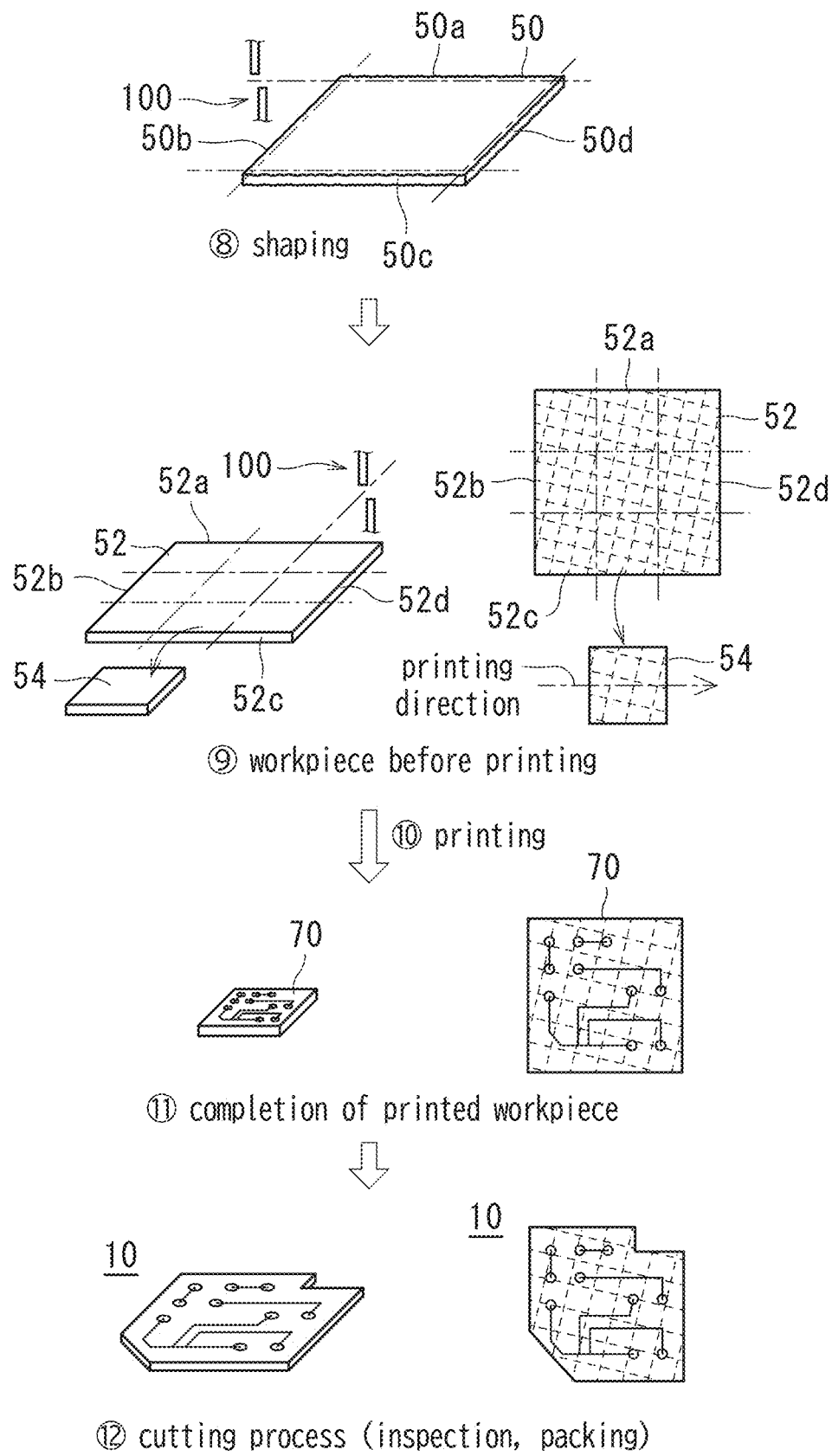
FIG. 9 is a perspective view depicting a method of forming a plurality of printed wiring boards from the copper-clad laminate.

Another manufacturing method of Embodiment 1 of the printed wiring board 10 according to the present invention is described based mainly on FIG. 9.

Example 2

The printed wiring board 10 according to the present invention is manufactured by a "method of forming the workpiece 52 by shaping the copper-clad laminate (mother laminate) 50 and cutting the workpiece 52 to form small workpiece 54, and printing on the small workpiece 54" below depicted mainly in FIG. 9.

In the example of FIG. 9, the copper-clad laminate (mother laminate) 50 having the same structure as that of the copper-clad laminate (mother laminate) 50 of the example of FIG. 8 is used. In the example of FIG. 8, after the conductor pattern 80 is formed on the copper-clad laminate (mother laminate) 50, the copper-clad laminate is cut into the printed wiring boards 10 of the final size. By contrast, in the example of FIG. 9, after the copper-clad laminate (mother laminate) 50 is cut into the printed wiring boards 10 of the final size, the conductor pattern 80 is formed on each small workpiece 54, which is a small piece of the workpiece 52.

The workpiece 52 obtained by shaping the copper-clad laminate (mother laminate) 50 obtained by the same method as that of Example 1 is set on the cutting-out apparatus 120, for example, a stamping apparatus such as a servo press machine.

The workpiece 52 obtained by shaping the copper-clad laminate (mother laminate) 50 is arranged between the upper blade 102 and the lower blade 104 so that a linear portion of blades (upper blade 102 and lower blade 104) extending in the longitudinal direction of the cutting blade 100 extends in a direction orthogonal to the upper end edge 52a and the lower end edge 52c of the workpiece 52 obtained by shaping the copper-clad laminate (mother laminate) 50, and the workpiece 52 obtained by shaping the copper-clad laminate (mother laminate) 50 is cut by the cutting blade 100 in a width direction.

Here, the workpiece 52 obtained by shaping the copper-clad laminate (mother laminate) 50 is arranged between the upper blade 102 and the lower blade 104 so that the extending direction of the warp threads 22 or the weft threads 24 of the sheet material 16 configuring the copper-clad laminate (mother laminate) 50 and a linear portion of the upper blade 102 and the lower blade 104 extending in the longitudinal direction of the cutting blade 100 diagonally cross, and is cut by the upper blade 102 and the lower blade 104 so as to diagonally cross the warp threads 22 and the weft threads 24.

That is, by adjusting a positioning guide for the cutting blade 100 provided to the cutting-out apparatus 120, the workpiece 52 is set between the upper blade 102 and the lower blade 104 of the cutting blade 100 so that an angle formed by the linear portion of the blade (the upper blade 102 and the lower blade 104) extending in the longitudinal direction of the cutting blade 100 and the extending direction of the warp threads 22 or the weft threads 24 of the copper-clad laminate (mother laminate) 50 is equal to or larger than 5 degrees and equal to or smaller than 30 degrees.

Furthermore, a case in which the workpiece 52 is stamped to form the printed workpiece 70 is described.

When the workpiece 52 is cut, the blade (upper blade 102 and lower blade 104) of the cutting blade 100 for cutting the workpiece 52 is disposed in a direction orthogonal to the linear right end edge 52d and left end edge 52b of the workpiece 52 obtained by shaping the copper-clad laminate (mother laminate) 50. Here, it is configured that the warp threads 22 and the weft threads 24 of the cloth-like material 26 is cut as being tilted at an angle equal to or larger than 5 degrees and equal to or smaller than 30 degrees with respect to the weft threads 24 of the sheet material 16 to form the small workpiece 54 serving as the printed workpiece 70.

Then, the workpiece 52 is stamped to form small workpiece 54 by cutting in parallel with the left end edge 52b and the right end edge 52d of the workpiece 52.

Here, when the copper-clad laminate (mother laminate) 50 is cut to form the quadrate-shaped workpiece 52, it is configured that the copper-clad laminate is positioned to be oriented to the blades (upper blade 102 and lower blade 104) of the cutting blade 100 for cutting into the small workpiece 54 so as to be cut in a direction orthogonal to the linear right end edge 52d and left end edge 52b, and the warp threads 22 and the weft threads 24 of the cloth-like material 26 are cut with a tilt at an angle equal to or larger than 5 degrees and equal to or smaller than 30 degrees with respect to the weft threads 24 to form the small workpiece 54.

In this embodiment, when the square-shaped workpiece 52 is formed, the copper-clad laminate is tilted to form an angle of 13.05 degrees with respect to the warp threads 22 and the weft threads 24 of the workpiece 52. When the rectangular-shaped workpiece 52 is formed, the copper-clad laminate is tilted to form an angle of 10.39 degrees with respect to the warp threads 22 and the weft threads 24.

Next, the conductor pattern 80 is printed on the small workpiece 54 to form the printed workpiece 70.

Lastly, the printed workpiece 70 is stamped by the stamping apparatus. With this, the printed wiring board 10 of a desired size can be obtained from the copper-clad laminate (mother laminate) 50.

As method of forming the printed wiring board 10 from the copper-clad laminate (mother laminate) 50, there are methods as depicted in FIG. 8A to FIG. 9.

In the description of the example, the copper-clad laminate (mother laminate) 50 formed by heating and pressurizing by the press machine is cut into the shape of a printed wiring board to form the workpiece 52, and printing required for the printed wiring board is performed on the workpiece 52 (refer to FIG. 9).

To allow a plurality of printed wiring boards 10 to be created from the copper-clad laminate (mother laminate) 50 formed by heating and pressurizing by the press machine, printing of the plurality of printed wiring boards 10 as divided may be performed on the workpiece 52 and then the workpiece 52 may be subjected to cutting process (refer to FIG. 8A).

As a method of printing an electric circuit to the copper-clad laminate (mother laminate) 50, platemaking and printing techniques as described below are used for creation.

On the copper foil surface of the copper-clad laminate (mother laminate) 50 having the copper foil for forming the metal layer (copper foil layer) 14 laminated on the prepreg 30 as the insulating material, a circuit pattern of a corrosion-resistant film is formed by screen printing or photoresist, copper of a non-image area is dissolved and removed with an etchant, and the corrosion-resistant film is next removed with an alkaline aqueous solution or the like to create an electric circuit.

4. Another Method of Manufacturing Printed Wiring Board 10

Still another manufacturing method of Embodiment 1 of the printed wiring board 10 according to the present invention is described based mainly on FIG. 10A and FIG. 10B or FIGS. 11A and 11B.

Example 3

A printed wiring board manufacturing method according to the present invention is a "method of creating a workpiece by tilting the mother laminate", including:

a step (S11) of preparing the sheet material (16) formed of cutting, in a direction orthogonal to or parallel to a warp thread and a weft thread, the cloth-like material 26 woven with an angle between the warp thread 22 and the weft thread 24 of the reinforced fiber 20 being 90 degrees;

a step (S15) of forming the metal layer 14 on a surface of the sheet material 16;

a step (S14) of preparing the mother laminate 50 including the sheet material 16 having the cloth-like material 26 woven with the angle between the warp thread 22 and the weft thread 24 of the reinforced fiber 20 being 90 degrees as an inner-layer board or an insulating board;

a step (S12) of arranging the mother laminate 50 on the cutting-out apparatus 120 so that the mother laminate 50 is tilted either one of leftward and rightward at an angle equal to or larger than 5 degrees and equal to or smaller than 30 degrees with respect to threads (warp threads 22 or weft threads 24) configuring the cloth-like material 26 of the mother laminate 50 and the cut portion 110 is cut so as to cross the cloth-like-material configuration threads 26 aligned in a cutting direction at an angle equal to or larger than 5 degrees and equal to or smaller than 30 degrees;

a step (S13) of creating the printed workpiece 70 of a desired size by cutting out the tilted mother laminate 50 so that the cut portion 110 is cut so as to cross the cloth-like-material configuration threads (warp threads 22 or weft threads 24) of the sheet material 16 aligned in the cutting direction at an angle equal to or larger than 5 degrees and equal to or smaller than 30 degrees; and a step (S16) of providing the conductor pattern 80 on the metal layer 14 along a circumferential edge portion of the printed workpiece 70.

The printed wiring board 10 according to the present invention is manufactured by a "method of creating a workpiece by tilting the mother laminate" below depicted mainly on FIGS. 11A and 11B.

First, an original sheet of cloth-like-material 26A serving as the cloth-like material 26 configuring the prepreg 30 is applied and impregnated with resin (for example, epoxy resin) to form the prepreg 30 having the resin layer 28 with resin cured to become semi-cured. The prepreg 30 is manufactured into a sheet shape forming the prepreg layer 12 (S11).

The original sheet of cloth-like-material 26A extends to be elongated in a transfer direction of the cloth-like material 26, and an upper end edge 26A*a* and a lower end edge 26A*c* extending in the transfer direction of the cloth-like material 26 are parallel to each other in a belt shape.

A sheet-like material (cloth-like material) obtained by impregnating the original sheet of cloth-like-material 26A (cloth-like material) with resin and having its upper and lower surfaces covered with thin resin is includes the belt-shaped, linear upper end edge 26A*a* and lower end edge 26A*c*.

Here, the warp threads 22 and the weft threads 24 of the reinforced fiber 20 configuring the original sheet of cloth-like-material 26A are orthogonal to or cross each other.

Next, the prepreg 30 including the sheet-like material (cloth-like material) is cut into a predetermined size to form the sheet material 16 (S11).

The original sheet of cloth-like-material 26A is cut by the cutting blade 100 in a direction orthogonal to the upper end edge 26A*a* and the lower end edge 26A*c* of this original sheet of cloth-like-material 26A.

Furthermore, small pieces of the cut original sheet of cloth-like-material 26A are cut by the cutting blade 100 in a direction orthogonal to a cut portion extending in an up-down direction (that is, a cut portion configuring the left end edge 16*b* and the right end edge 16*d* of the sheet material 16) to form the sheet material 16 including the upper end edge 16*a* and the lower end edge 16*c* and orthogonal to the left end edge 16*b* and the right end edge 16*d*.

The weft threads 24 of the reinforced fiber 20 of the cloth-like material 26 configuring the sheet material 16 extend to a direction orthogonal to the upper end edge 16*a* and the lower end edge 16*c* of the sheet material 16, and the weft threads 24 extend to a direction parallel to the right end edge 16*d* and the left end edge 16*b*.

Here, the sheet material is set between the upper blade 102 and the lower blade 104 of the cutting blade 100 so that, by adjusting the position of the cutting blade 100 provided to the cutting-out apparatus 120 (stamping apparatus), an angle formed by a linear portion of the blades (upper blade 102 and lower blade 104) extending in the longitudinal direction of the cutting blade 100 of the cutting-out apparatus 120 and the extending direction of the warp threads 22 or the weft threads 24 of the reinforced fiber 20 is the right angle.

Figure 10A:
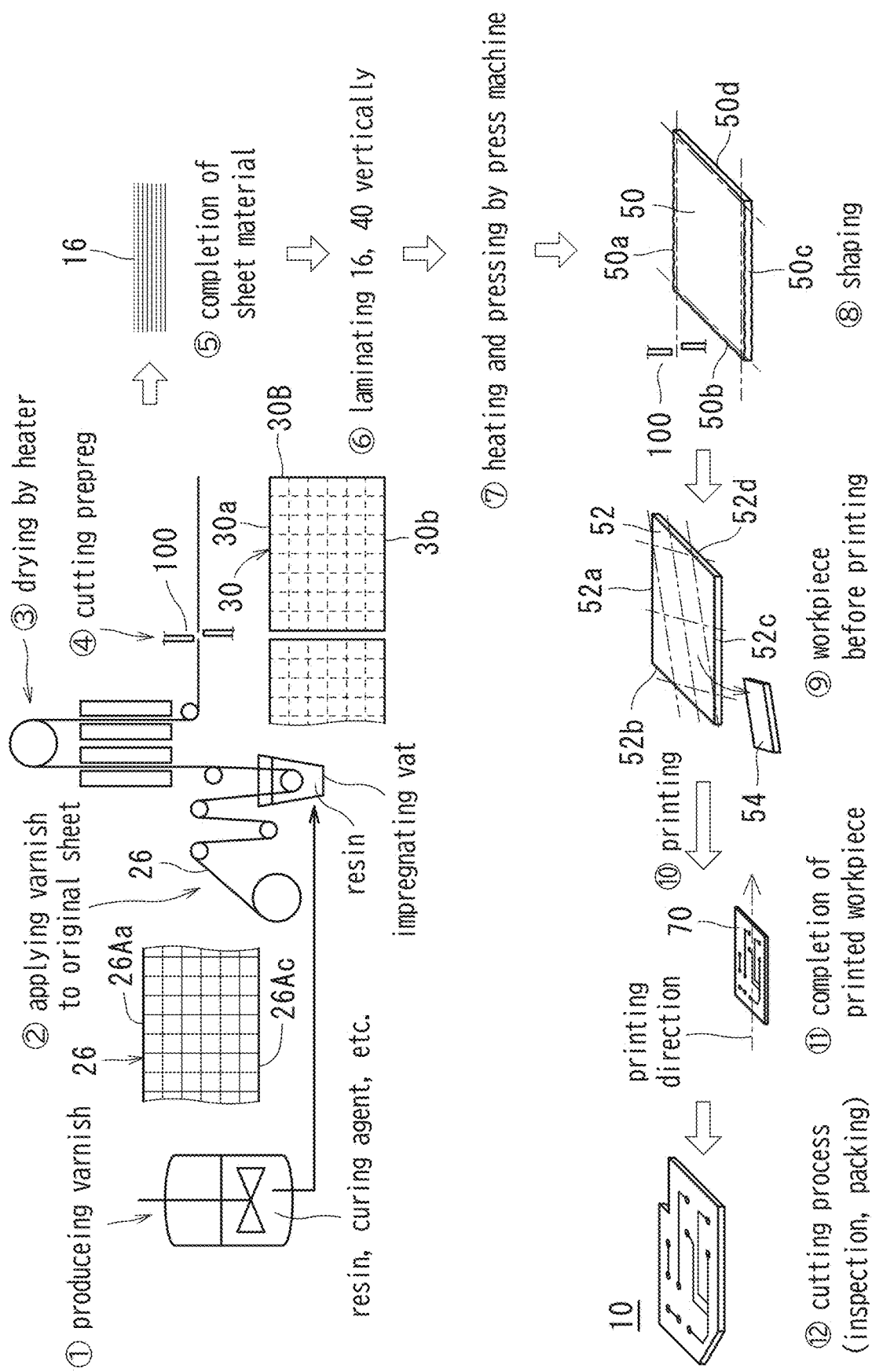
FIG. 10A is a diagram depicting a method of manufacturing a printed wiring board.

Next, a method of forming the copper-clad laminate (mother laminate) 50 by laminating the sheet materials 16 is described based mainly on FIG. 10A and FIG. 10B.

For the purpose of improving the strength of the printed wiring board 10, a plurality of sheet materials 16 configuring the prepreg layer 12 are laminated (S14).

Also, as depicted in FIG. 2, the prepregs 30 as insulating materials are laminated on both upper and lower surfaces of the core material 18 forming the copper-clad laminate (mother laminate) 50 to interpose the core material 18 therebetween, and may each have a copper foil configuring the conductor material (copper foil) 40 laminated thereon (S15).

On each of the upper and lower surfaces of the core material 18 serving as a board inner layer, a copper foil is affixed from the beginning, and is subjected to etching to form an inner-layer pattern Next, the conductor material (copper foil) 40 is mounted on one surface or both surfaces of the sheet material 16 configuring the prepreg layer 12, and is subjected to heat curing as being pressed (S14).

When the sheet material 16 and the conductor material (copper foil) 40 as being laminated are put into the vacuum oven 180 for heat pressurizing, resin is cured, and a laminate in a four-layer structure including the core material 18 and the conductor material (copper foil) 40 is obtained. With this, the copper-clad laminate 50 can be obtained.

Next, the obtained copper-clad laminate 50 is set on the cutting-out apparatus 120, that is, the stamping apparatus such as a servo press machine.

Lastly, stamping is performed by the cutting-out apparatus 120. With this, the printed wiring board 10 is shaped by removing an unnecessary portion so that the printed wiring board 10 of a desired size can be obtained.

Figure 11A:
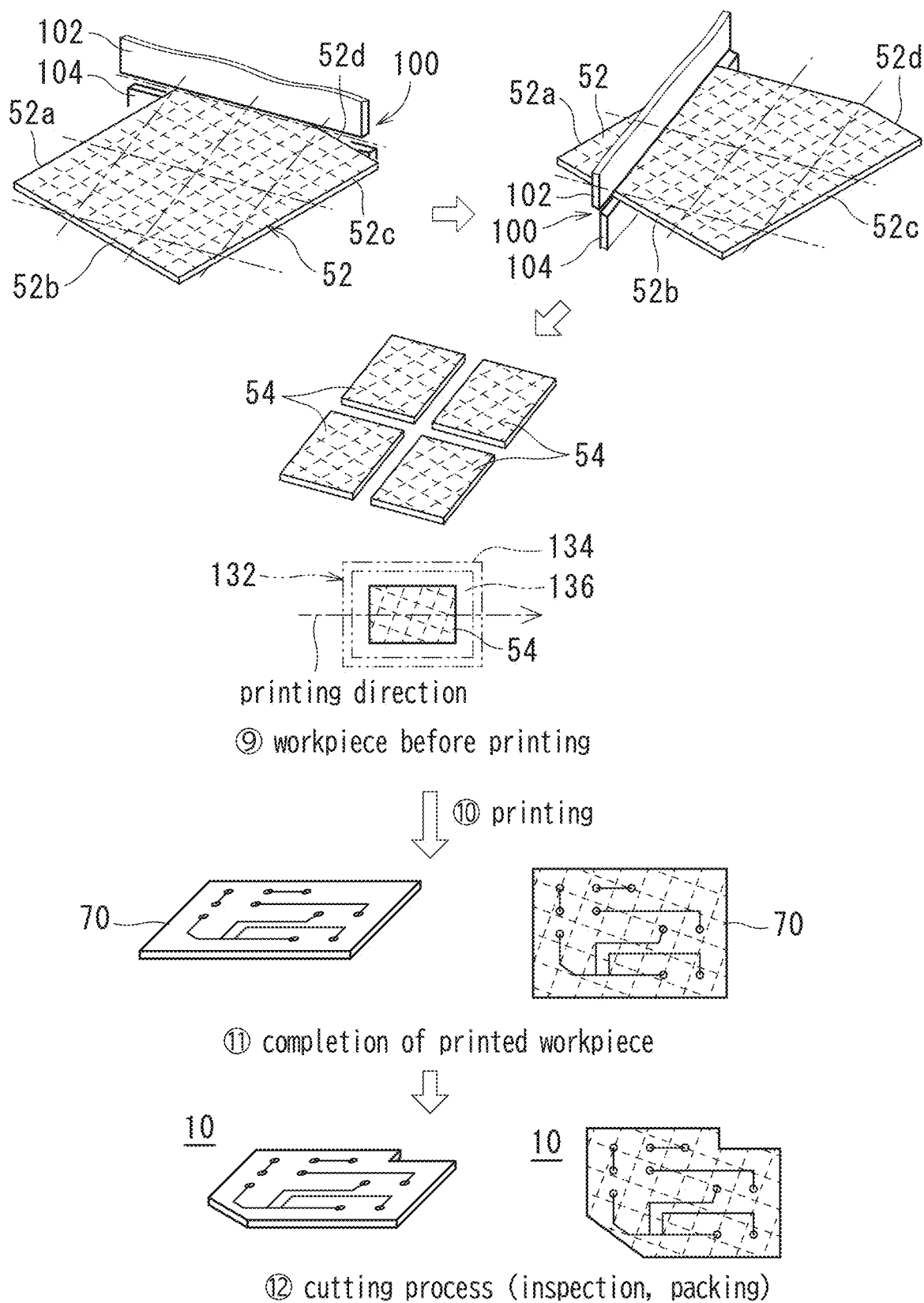
FIG. 11A is a diagram depicting a method of manufacturing a plurality of printed wiring boards from a workpiece.

As a method of forming the printed wiring board 10 from the copper-clad laminate 50, there is a method as depicted in FIGS. 11A to 11B

The copper-clad laminate (mother laminate) 50 formed by heating and pressurizing by the press machine is cut into a shape closely analogous to the printed wiring board 10 to form the workpiece 52, and the workpiece 52 is subjected to printing required for the printed wiring board to form the printed workpiece 70 having the conductor pattern 80 formed thereon (refer to FIGS. 11A and 11B).

First, a case in which the copper-clad laminate (mother laminate) 50 is stamped to form the workpiece 52 is described based mainly on FIGS. 11A and 11B.

When the copper-clad laminate (mother laminate) 50 formed by heating and pressurizing by the press machine is cut into the shape of the printed wiring board to form the workpiece 52, it is configured that the copper-clad laminate (mother laminate) 50 is cut by making the upper blade 102 and the lower blade 104 of the cutting blade 100 for cutting a quadrate shape orthogonal to the linear right end edge 50*d* and left end edge 50*b* of the copper-clad laminate (mother laminate) 50 to form the copper-clad laminate (mother laminate) 50 having the upper end edge 50*a* and the lower end edge 50*c* orthogonal to the right end edge 50*d* and the left end edge 50*b* to form the workpiece 52.

Next, a case in which the workpiece 52 is stamped to form the printed workpiece 70 serving as the printed wiring board 10 is described.

When the workpiece 52 is cut to form the printed workpiece 70, the workpiece 52 is cut, with the linear upper end edge 52*a* and lower end edge 52*c* of the workpiece 52 being tilted at an angle equal to or smaller than 5 degrees and equal to or larger than 30 degrees with respect to the upper blade 102 or the lower blade 104 of the cutting blade 100 for cutting a quadrate shape, to form the left end edge 54*b* and the right end edge 54*d* of the small workpiece 54, and the small workpiece 54 is cut by the cutting blade 100 in a direction orthogonal to the left end edge 54*b* and the right end edge 54*d* of the small workpiece 54 to form the upper end edge 54*a* and the lower end edge 54*c*, thereby forming the small workpiece 54.

The copper-clad laminate (mother laminate) 50 is arranged on the cutting-out apparatus 120 so that the upper blade 102 and the lower blade 104 of the cutting blade 100 is tilted either one of leftward and rightward at an angle equal to or larger than 5 degrees and equal to or smaller than 30 degrees with respect to the copper-clad laminate (mother laminate) 50 and threads (warp threads 22 or weft threads 24) configuring the cloth-like material 26 which forms the copper-clad laminate and the cut portion 110 crosses the cloth-like-material configuration threads 26 aligned on the cutting direction at an angle equal to or larger than 5 degrees and equal to or smaller than 30 degrees (S12), the tilted copper-clad laminate (mother laminate) 50 is cut so that the cut portion 110 crosses the cloth-like-material configuration threads (warp threads 22 or weft threads 24) of the sheet material 16 aligned in the cutting direction at an angle equal to or larger than 5 degrees and equal to or smaller than 30 degrees to create the printed workpiece 70 of a desired size (S13).

In this embodiment, when the square-shaped workpiece 52 is cut to form the small workpiece 54, the square-shaped workpiece is tilted so that the weft threads 24 of the sheet material 16 form an angle of 13.05 degrees with respect to the right end edge 52*d* and the left end edge 52*b* (refer to FIG. 1). When the rectangular-shaped workpiece 52 is cut to form the small workpiece 54, the rectangular-shaped workpiece is tilted so that the weft threads 24 of the sheet material 16 form an angle of 10.39 degrees with respect to the right end edge 52*d* and the left end edge 52*b*.

Also, when four small workpiece 54 are cut out from one workpiece 52, cutting is made, in some cases, with an angle of 20.1 degrees with respect to the upper end edge 52*a* and the lower end edge 52*c* and, in other cases, with an angle of 5.9 degrees with respect to the upper end edge 52*a* and the lower end edge 52*c* (refer to FIG. 11B).

As a method of printing an electric circuit on the small workpiece 54, platemaking and printing techniques as described below are used for creation.

On the copper foil surface of the copper-clad laminate (mother laminate) 50 with the copper foil forming the metal layer (copper foil layer) 14 laminated on the prepreg 30 as an insulating material, a circuit pattern of a corrosion-resistant film is formed by screen printing or photoresist, and copper of a non-image area is dissolved and removed with an etchant.

Next, the corrosion-resistant film is removed with an alkaline aqueous solution or the like to create an electric circuit.

In this example, the screen printing plate 132 for printing on the metal layer 14 is disposed on the small workpiece 54 so that its upper and lower end edges are along upper and lower end edges (upper end edge 54*a* and lower end edge 54*c*) of the small workpiece 54.

The upper and lower end edges of a streak (electric circuit) printed by the screen printing plate 132 are formed along the upper and lower end edges (upper end edge 54*a* and lower end edge 54*c*) of the small workpiece 54.

Note that the screen printing plate 132 for screen printing is formed by stretching the screen gauze 136 over the frame body 134 with tension, and the frame body 134 is normally a metal frame body referred to as a platemaking frame.

5. Printed Wiring Board Manufacturing Method

The printed wiring board 10 according to the present invention is manufactured by using, for example, a manufacturing method of Example 4 below.

Example 4

Figure 12A:
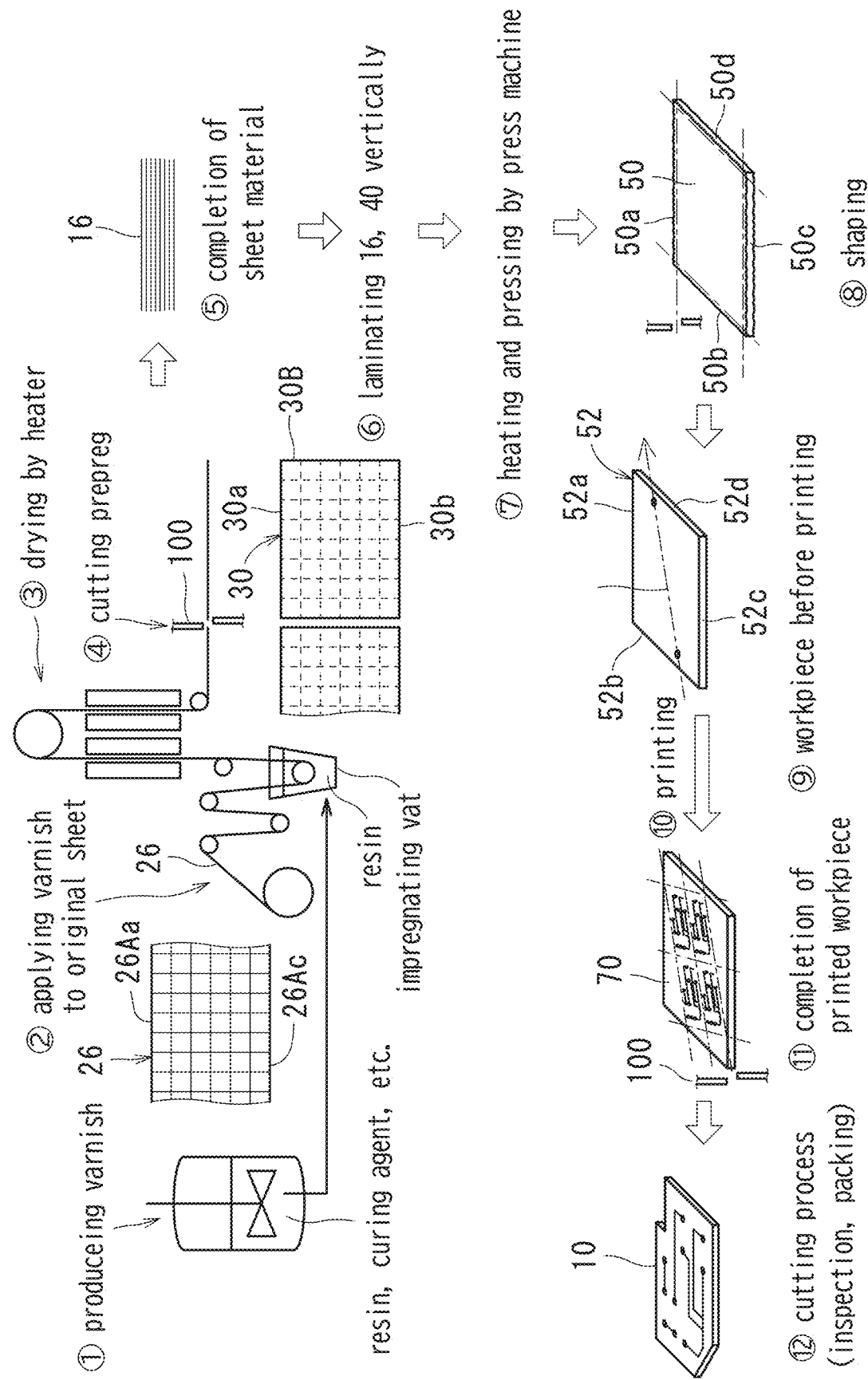
FIG. 12A is a diagram depicting a method of manufacturing a printed wiring board.
Figure 12B:
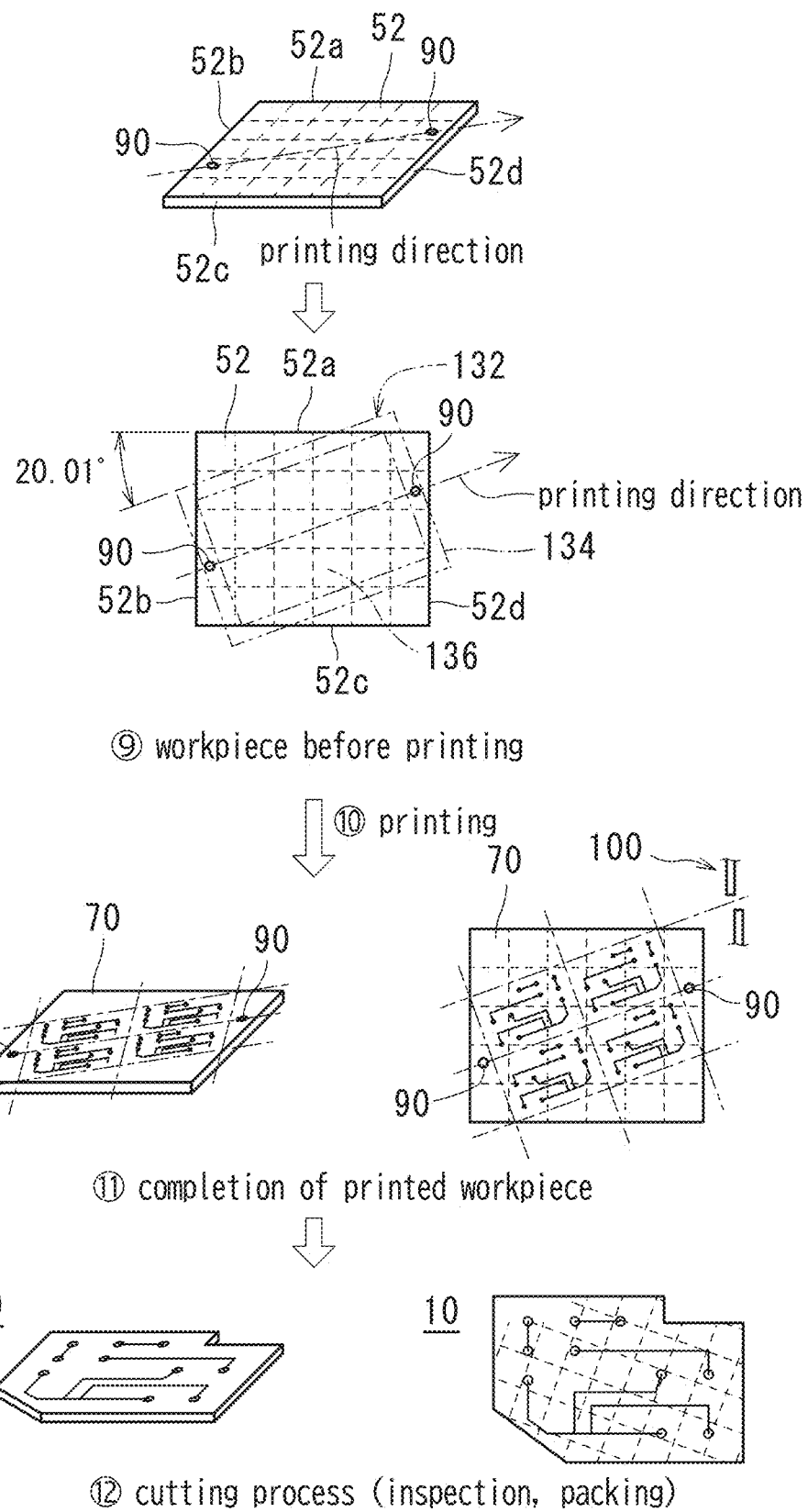
FIG. 12B is a perspective view depicting a method of forming a printed wiring board from a copper-clad laminate.

The method of manufacturing the printed wiring board 10 according to the present invention is described based mainly on FIG. 12A or FIG. 12B.

The method of manufacturing the printed workpiece 70 according to the present invention is a "method of forming a streak portion formed by printing as being tilted with respect to the cloth-like material of the mother laminate", the method including:
- a step (S11) of preparing the sheet material 16 including the cloth-like material 26 woven of the reinforced fiber 20 with an angle between the warp thread 22 and the weft thread 24 of the reinforced fiber being 90 degrees;
- a step (S15) of forming the metal layer 14 on a surface of the sheet material 16;
- a step (S14) of preparing the mother laminate 50 including, as an inner-layer board or an insulating board, the sheet material 16 including the cloth-like material 26 woven with an angle between the warp thread 22 and the weft thread 24 of the reinforced fiber 20 being 90 degrees;
- a step (S17) of arranging the mother laminate 50 on the pattern formation printing apparatus 130 so that the mother laminate 50 is tilted either one of leftward and rightward at an angle equal to or larger than 5 degrees and equal to or smaller than 30 degrees with respect to the threads (warp threads 22 or weft threads 24) configuring the cloth-like material 26 of the sheet material 16 of the mother laminate 50 and the cut portion 110 is cut so as to cross the cloth-like-material configuration threads (warp threads 22 or weft threads 24) of the sheet material 16 aligned on the cutting blade 100 at an angle equal to or larger than 5 degrees and equal to or smaller than 30 degrees;
- a step (S18) of providing, on the tilted mother laminate 50, the conductor pattern 80 on the metal layer 14 by the pattern formation printing apparatus 130 so that the cut portion 110 crosses the cloth-like-material configuration threads (warp threads 22 or weft threads 24) aligned on the cutting blade 100 at an angle equal to or larger than 5 degrees and equal to or smaller than 30 degrees;
- a step (S19) of cutting out the mother laminate 50 along the conductor pattern 80 and creating the printed workpiece 70 with the cut portion 110 crosses the cloth-like-material configuration threads (warp threads 22 or weft threads 24) of the sheet material 16 aligned on the cutting blade 100 at an angle equal to or larger than 5 degrees and equal to or smaller than 30 degrees; and
- a step (S16) of providing the conductor pattern 80 on the metal layer 14 along a circumferential edge portion of the printed workpiece 70.

The printed wiring board 10 according to the present invention is manufactured by a "method of forming a streak portion formed by printing as being tilted with respect to the cloth-like material of the mother laminate" below depicted mainly in FIGS. 12A and 12B.

First, the original sheet of cloth-like-material 26A serving as the cloth-like material 26 configuring the prepreg 30 is applied and impregnated with resin (for example, epoxy resin) to form the prepreg 30 having the resin layer 28 with resin cured to become semi-cured. The prepreg 30 is manufactured into a sheet shape forming the prepreg layer 12 (S11).

The original sheet of cloth-like-material 26A extends to be elongated in the transfer direction of the cloth-like material 26, and the upper end edge 26Aa and the lower end edge 26Ac extending in the transfer direction of the cloth-like material 26 are parallel to each other in a belt shape.

The sheet-like material (cloth-like material) obtained by impregnating the original sheet of cloth-like-material 26A (cloth-like material) with resin and having its upper and lower surfaces covered with thin resin includes the belt-shaped, linear upper end edge 26Aa and lower end edge 26Ac.

Here, the warp threads 22 and the weft threads 24 of the reinforced fiber 20 configuring the original sheet of cloth-like-material 26A are orthogonal to or cross each other.

Next, the prepreg 30 including the sheet-like material (cloth-like material) is cut into a predetermined size to form the sheet material 16 (S12).

The original sheet of cloth-like-material 26A is cut by the cutting blade 100 in a direction orthogonal to the upper end edge 26Aa and the lower end edge 26Ac of this original sheet of cloth-like-material 26A.

Furthermore, small pieces of this cut original sheet of cloth-like-material 26A are cut by the cutting blade 100 in a direction orthogonal to a cut portion extending in an up-down direction (that is, a cut portion configuring the left end edge 16b and the right end edge 16d of the sheet material 16) to form the sheet material 16 including the upper end edge 16a and the lower end edge 16c and orthogonal to the left end edge 16b and the right end edge 16d.

The warp threads 22 and the weft threads 24 of the reinforced fiber 20 of the cloth-like material 26 configuring the sheet material 16 extend to a direction orthogonal to or parallel to the upper end edge 16a and the lower end edge 16c of the sheet material 16.

Here, the sheet material is set between the upper blade 102 and the lower blade 104 of the cutting blade 100 so that, by adjusting the position of the cutting blade 100 provided to the cutting-out apparatus 120 (stamping apparatus), an angle formed by a linear portion of the blades (upper blade 102 and lower blade 104) extending in the longitudinal direction of the cutting blade 100 of the cutting-out apparatus 120 and the extending direction of the warp threads 22 or the weft threads 24 of the reinforced fiber 20 is the right angle (S12).

Further, a case is described in which the copper-clad laminate (mother laminate) 50 is stamped to form the workpiece 52.

When the copper-clad laminate (mother laminate) 50 is cut, it is configured that the copper-clad laminate is cut by the cutting blade 100 in a direction orthogonal to the linear right end edge 50d and the left end edge 50b of the copper-clad laminate (mother laminate) 50 to form the workpiece 52.

Furthermore, a method of printing the conductor pattern 80 on the workpiece 52 formed of the copper-clad laminate 50 to form the conductor pattern 80 on the workpiece 52 is described.

When the screen printing plate 132 is disposed on the workpiece 52, the screen printing plate 132 is set so as to be able to be disposed so that the screen printing plate 132 is tilted at an angle equal to or larger than 5 degrees and equal to or smaller than 30 degrees with respect to the linear right end edge 52d and the left end edge 52b of the workpiece 52.

Here, guide holes 90 and 92 are formed so that the screen printing plate is tilted either one of leftward and rightward at an angle equal to or larger than 5 degrees and equal to or smaller than 30 degrees with respect to the outer circumferential edge (upper end edge 52a and the lower end edge 52c) of the workpiece 52, and the screen printing plate 132 of the pattern formation printing apparatus 130 is arranged along a line connecting the guide holes 90 and 92.

The manufacturing method of this example includes a step of tilting, either one of up-down or leftward-rightward, the screen printing plate 132 for pattern formation for printing the printed-wiring conductor pattern 80 on the copper-clad laminate (mother laminate) 50.

In this example, when the square-shaped printed work-piece 70 is formed, the screen printing plate 132 is tilted so as to form an angle of 13.05 degrees with respect to the upper end edge 52a and the lower end edge 52c of the workpiece 52. When the rectangular-shaped printed work-piece 70 is formed, the screen printing plate 132 is tilted so as to form an angle of 10.39 degrees with respect to the upper end edge 52a and the lower end edge 52c of the workpiece 52.

The workpiece 52 is arranged on pattern formation printing apparatus 130 so that the screen printing plate 132 is tilted either of leftward and rightward at an angle equal to or larger than 5 degrees and equal to or smaller than 30 degrees with respect to the threads (warp threads 22 or weft threads 24) configuring the cloth-like material 26 of the sheet material 16 of the workpiece 52 and the cut portion 110 is cut so as to cross the cloth-like-material configuration threads (warp threads 22 or weft threads 24) of the sheet material 16 aligned on the cutting blade 100 at an angle equal to or larger than 5 degrees and equal to or smaller than 30 degrees (S17).

On the tilted workpiece 52, the conductor pattern 80 is provided on the metal layer 14 by the pattern formation printing apparatus 130 so that the cut portion 110 crosses the cloth-like-material configuration threads (warp threads 22 or weft threads 24) aligned on the cutting blade 100 at an angle equal to or larger than 5 degrees and equal to or smaller than 30 degrees (S18).

The workpiece 52 is cut out along the conductor pattern 80, and created the printed workpiece 70 with the cut portion 110 crossing the cloth-like-material configuration threads (warp threads 22 or weft threads 24) aligned on the cutting blade 100 of the sheet material 16 at an angle equal to or larger than 5 degrees and equal to or smaller than 30 degrees (S19).

Lastly, the printed workpiece 70 is stamped by the cutting-out apparatus 120 (stamping apparatus). With this, the printed wiring board 10 of a desired size can be obtained from the printed workpiece 70.

As a method of forming the printed wiring board 10 from the copper-clad laminate 50, there is a method as depicted in FIGS. 12A to 12B.

The workpiece 52 obtained by shaping the copper-clad laminate 50 formed by heating and pressurizing by the press machine is cut into the shape of the printed wiring board 10 to form the printed workpiece 70, and the printed workpiece 70 may be subjected to printing required for the printed wiring board 10.

As a method of printing an electric circuit on the copper-clad laminate (mother laminate) 50, platemaking and printing techniques as described below are used for creation.

On the copper foil surface of the copper-clad laminate (mother laminate) 50 having the copper foil for forming the metal layer (copper foil layer) 14 laminated on the prepreg 30 as the insulating material, a circuit pattern of a corrosion-resistant film is formed by screen printing or photoresist, copper of a non-image area is dissolved and removed with an etchant, and the corrosion-resistant film is next removed with an alkaline aqueous solution or the like to create an electric circuit.

6. Modification Example

A method of manufacturing the printed wiring board 10 of Embodiment 2 according to the present invention is a modification example different from Embodiment 1 in the laminating method of laminating a plurality of prepregs with a reverse bias.

Figure 13A:
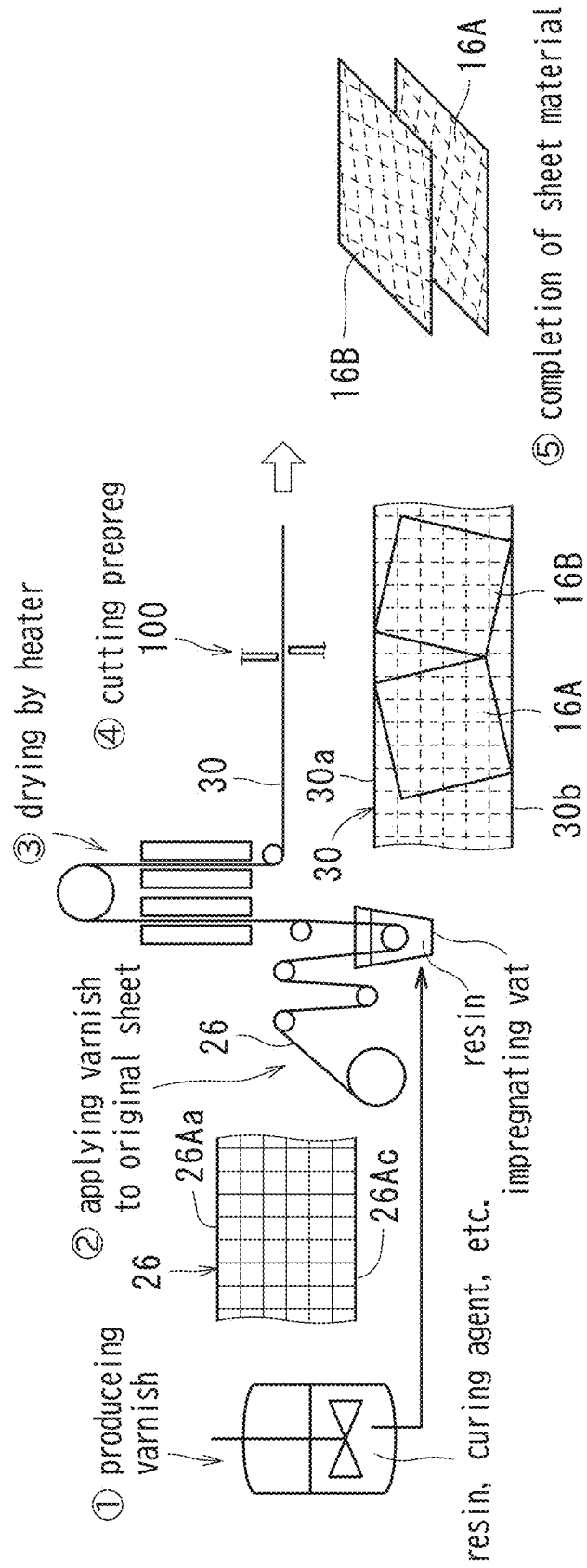
FIG. 13A is a diagram depicting a method of manufacturing a printed wiring board by using a prepreg with a reverse bias.
Figure 13B:
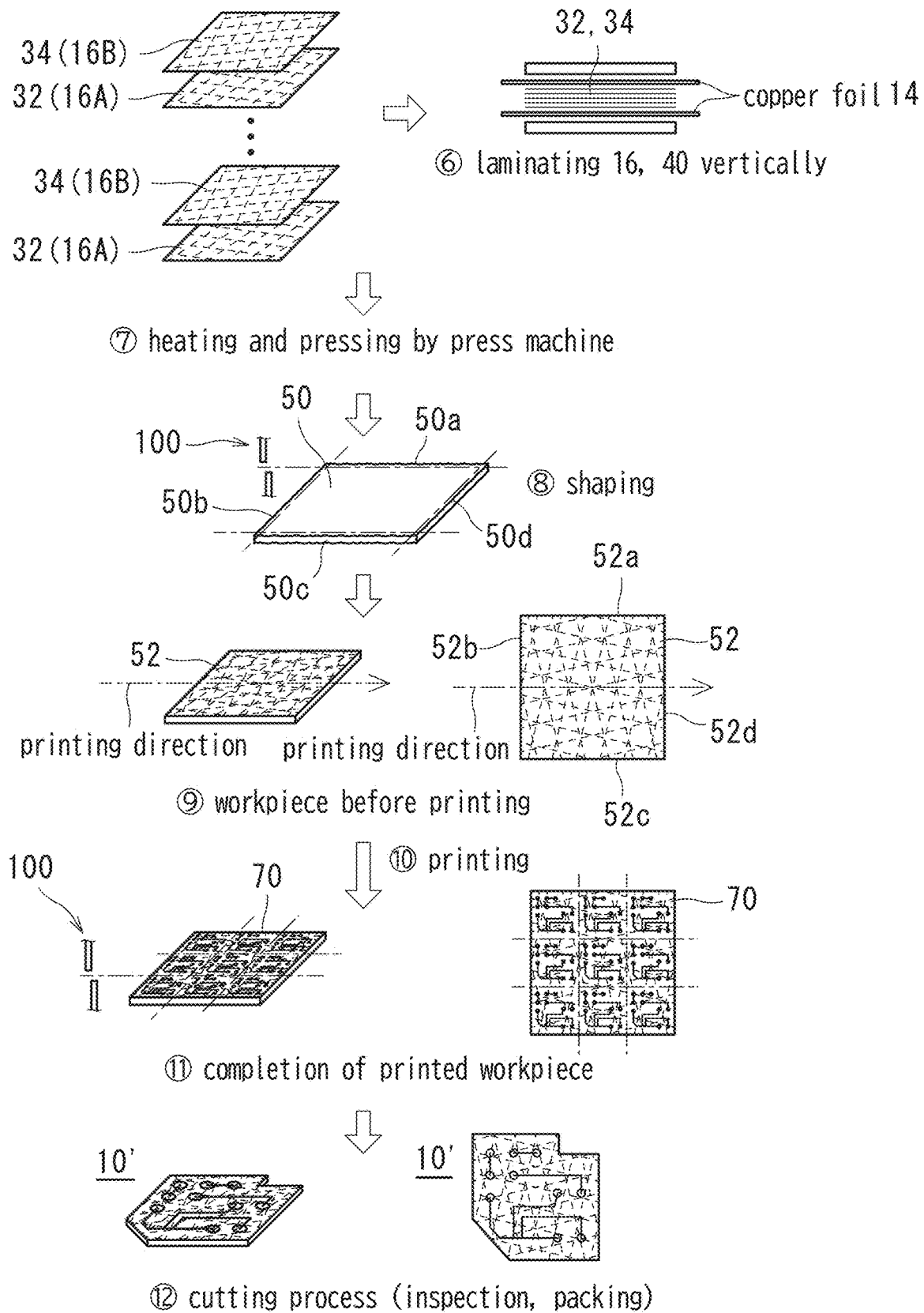
FIG. 13B is a diagram depicting a method of forming a printed wiring board from a copper-clad laminate using a prepreg with a reverse bias.

The method of manufacturing a printed wiring board 10' of the modification example of Embodiment 2 according to the present invention is described based mainly on FIGS. 13A and 13B.

The printed wiring board 10' of this Embodiment 2 is characterized in that, as depicted in FIGS. 5 to 7, the sheet material 16 configuring the prepreg layer 12 is configured of two types of sheet materials, that is, the first sheet material 16A and the second sheet material 16B, and the first sheet material 16A and the second sheet material 16B having fiber directions of two types are laminated with a reverse bias.

The structure of the prepreg layer 12 formed by laminating the prepreg 30 is different from that of the printed wiring board 10 of Embodiment 1.

The extending directions of the warp threads 22 and the weft threads 24 of the first sheet material 16A laminated by the manufacturing method of this modification example have a reverse bias with respect to the extending directions of the warp threads 22 and the weft threads 24 of the second sheet material 16B.

The first warp threads 22 and the first weft threads 24 configuring the first sheet material 16A are rotated counterclockwise at an angle equal to or larger than 5 degrees and equal to or smaller than 30 degrees in plan view to form the odd layer 32 of the prepreg layer 12. The second warp threads 22 and the second weft threads 24 configuring the second sheet material 16B are rotated clockwise at an angle equal to or larger than 5 degrees and equal to or smaller than 30 degrees in plan view to form the even layer 34 of the prepreg layer 12. The first sheet material 16A and the second sheet material 16B are laminated with a reverse bias.

The first warp threads 22 and the first weft threads 24 are orthogonal, and the second warp threads 22 and the second weft threads 24 are orthogonal. When the first sheet material 16A and the second sheet material 16B as described above are laminated, the point of intersection O1 of the first warp thread 22 and the first weft thread 24 of the first sheet material 16A and the point of intersection O2 of the second warp thread 22 and the second weft thread 24 of the second sheet material 16B are matched, and the first sheet material 16A is rotated to a counterclockwise direction at a predetermined angle, and the second sheet material 16B is rotated to a clockwise direction at a predetermined angle.

In this embodiment, it is formed so that, considering as a plane including two straight lines when the lines are crossing, an angle formed by the first warp thread 22 configuring the first sheet material 16A and the lower end edge of the first prepreg, that is, an angle formed by two straight lines obtained by moving in parallel a straight line extending in parallel with the extending direction of the first warp thread 22 to a position of crossing a straight line extending in parallel with the lower end edge of the first sheet material 16A, the angle formed by the two crossing straight lines being taken as an angle formed by the original two straight lines, is 13.05 degrees.

In this embodiment, it is formed so that, considering as a plane including two straight lines when the lines are crossing, an angle formed by the second warp thread 22 configuring the second sheet material 16B and the lower end edge of the second prepreg, that is, an angle formed by two straight lines obtained by moving in parallel a straight line extending in parallel with the extending direction of the second warp thread 22 to a position of crossing a straight line extending in parallel with the lower end edge of the second sheet material 16B, the angle formed by the two crossing straight lines being taken as an angle formed by the original two straight lines, is 13.05 degrees.

The printed wiring board 10' of Embodiment 2 has a plurality of prepreg layers 12. For example, the prepreg layer 12 with an angle formed by the warp thread 22 or the weft thread 24 of the reinforcing material 26 of the prepreg layer 12 and an end edge of the prepreg layer 12 is equal to or larger than 5 degrees and equal to or smaller than 30 degrees is taken as the odd layer 32. Also, the prepreg layer with the prepreg layer 12 rotated by 90 degrees in a left-right direction is taken as the even layer 34. Since the direction of the reinforced fiber 20 varies depending on the odd layer 32 and the even layer 34 of the prepreg layer 12, with the odd layer 32 and the even layer 34 being laminated, the reinforced fiber 20 of either one can be reliably cut even if the printed wiring board 10' of Embodiment 2 is cut out into a desired size. Therefore, fiber waste and fuzzing with cutting of the printed wiring board 10' of Embodiment 2 can be suppressed. Furthermore, since the prepreg layers 12 are laminated, the strength is increased, and the printed wiring board 10' with high reliability can be manufactured.

As described above, while the embodiments of the present invention have been disclosed in the above description, the present invention is not limited to these.

That is, it is possible to add various changes to the mechanism, shape, material, quantity, position, arrangement, and so forth of the above-described embodiments without deviating from the scope of the technical idea and the object of the present invention, and these changes are included in the present invention.

Figure 14:
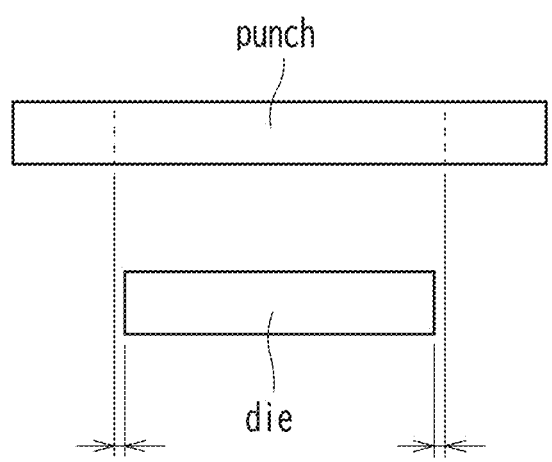
FIG. 14 is a front view of a metal mold, which is one example of a cutting blade.

In the embodiments described above, the cutting blade is described as the cutting blade of the shear apparatus. However, as depicted in FIG. 14, cutting can be made by using a metal mold having an upper blade (punch) and a lower blade (die) with an appropriate clearance. As depicted in FIG. 14, when the metal-molded cutting blade is tilted with respect to the warp threads 22 and the weft threads 24 of the cloth-like material 26 configuring the sheet material 16 in consideration of the clearance and is used to cut, the fiber of the reinforced fiber 20 can be reliably cut, and fuzzing can be prevented.

REFERENCE SIGNS LIST

10, 10' printed wiring board
12 prepreg layer
12a upper end edge
12b left end edge
12c lower end edge
12d right end edge
12e uneven shape
12f through hole (relatively large through hole)
12g through hole (long narrow hole)
14 metal layer (copper foil)
16 sheet material
16a upper end edge
16b left end edge
16c lower end edge
16d right end edge
16e uneven shape
16A first sheet material
16B second sheet material 18 core material
20 reinforced fiber
22 warp thread
24 weft thread
26 cloth-like material
26A original sheet of cloth-like-material
26Aa upper end edge
26Ac lower end edge
28 resin layer
30 prepreg
30a upper end edge
30b lower end edge
30c lower end edge
30d right end edge
32 odd layer
34 even layer
40 conductor material (copper foil)
50 copper-clad laminate (mother laminate)
50a upper end edge
50b left end edge
50c lower end edge
50d right end edge
52 workpiece
52a upper end edge
52b left end edge
52c lower end edge
52d right end edge
54 small workpiece
54a upper end edge
54b left end edge
54c lower end edge
54d right end edge
70 printed workpiece
80 conductor pattern
90 guide hole
100 cutting blade
102 upper blade
104 lower blade
110 cut portion
120 cutting-out apparatus
130 pattern formation printing apparatus
132 screen printing plate
134 frame body
136 screen gauze
180 vacuum oven

The invention claimed is:

1. A printed wiring board comprising a sheet material including a cloth-like material woven of reinforced fiber, wherein
the cloth-like material is woven at an angle between a warp thread and a weft thread of the reinforced fiber of the sheet material being 90 degrees,
in the sheet material, threads configuring the cloth-like material are cut so that one side of a circumferential edge portion of the sheet material is tilted either one of leftward and rightward at an angle equal to or larger than 5 degrees and equal to or smaller than 30 degrees and a length of a cut portion obtained by cutting out the cloth-like-material configuration threads aligned on a cutting blade with the cutting blade is longer by 0.3 mm to 6.3 mm than a total length of a clearance between an upper blade and a lower blade configuring the cutting blade for cutting the cloth-like material and a thickness of the cloth-like-material configuration threads aligned on the cutting blade, and
the sheet material configures an inner-layer board or an insulating board, a metal layer is formed on a surface of the sheet material, and a conductor pattern is formed to the metal layer.

2. The printed wiring board according to claim 1, comprising a sheet material including a cloth-like material woven of reinforced fiber, wherein
the sheet material has a first sheet material and a second sheet material,
the first sheet material is woven so that an angle between the warp thread and the weft thread of the reinforced fiber is 90 degrees, and the reinforced fiber is cut so that the warp thread or the weft thread forms an angle equal to or larger than 6 degrees and equal to or smaller than 45 degrees on one side of a circumferential edge portion of the first sheet material,
the second sheet material is woven so that an angle between the warp thread and the weft thread of the reinforced fiber is 90 degrees, and the reinforced fiber is cut so that the warp thread or the weft thread forms an angle equal to or larger than 6 degrees and equal to or smaller than 45 degrees on one side of a circumferential edge portion of the second sheet material, and
the printed wiring board has the first sheet material and the second sheet material alternately laminated with different fiber directions.

* * * * *